United States Patent
Iino et al.

(10) Patent No.: US 7,005,776 B1
(45) Date of Patent: Feb. 28, 2006

(54) ULTRASONIC MOTOR AND ELECTRONIC APPARATUS EQUIPPED WITH ULTRASONIC MOTOR

(75) Inventors: Akihiro Iino, Chiba (JP); Masao Kasuga, Chiba (JP); Kenji Suzuki, Chiba (JP)

(73) Assignee: Seiko Instruments Inc., Chiba (JP)

( * ) Notice: Subject to any disclaimer, the term of this patent is extended or adjusted under 35 U.S.C. 154(b) by 658 days.

(21) Appl. No.: 09/290,046

(22) Filed: Apr. 12, 1999

(30) Foreign Application Priority Data

Apr. 13, 1998 (JP) ............... 10-101577
Jan. 14, 1999 (JP) ............... 11-008083

(51) Int. Cl.
*H01L 41/08* (2006.01)

(52) U.S. Cl. ............... 310/316.01; 310/323.06; 310/323.12; 310/316.02

(58) Field of Classification Search ........... 310/316.01, 310/316.02, 323.06, 323.12, 323.16, 366
See application file for complete search history.

(56) References Cited

U.S. PATENT DOCUMENTS

| | | | | |
|---|---|---|---|---|
| 4,692,649 A | * | 9/1987 | Izukawa et al. ....... 310/316.02 |
| 5,001,404 A | * | 3/1991 | Kataoka ............ 310/316.02 X |
| 5,198,714 A | * | 3/1993 | Salomon et al. ....... 310/323.06 |
| 5,406,160 A | * | 4/1995 | Shirasaki ............ 310/323.06 |
| 5,438,229 A | * | 8/1995 | Ohtsuchi et al. ....... 310/316.02 |
| 5,448,128 A | * | 9/1995 | Endo et al. ............ 310/323.12 |
| 5,563,478 A | * | 10/1996 | Suganuma ........... 310/316.02 |
| 5,739,621 A | * | 4/1998 | Atsuta ............... 310/316.02 |
| 5,763,981 A | * | 6/1998 | Okazaki et al. ..... 310/323.12 X |
| 5,780,955 A | * | 7/1998 | Iino et al. ............ 310/316.02 |
| 5,821,667 A | * | 10/1998 | Takagi et al. ....... 310/323.12 X |
| 6,064,138 A | * | 5/2000 | Iino et al. ............. 310/316.01 |

* cited by examiner

*Primary Examiner*—Mark O. Budd
(74) *Attorney, Agent, or Firm*—Adams & Wilks

(57) ABSTRACT

An ultrasonic motor comprises a piezoelectric vibrating member having a detecting polarized portion for detecting a drive signal having a drive frequency of the detecting polarized portion and a driving polarized portion for receiving the drive signal to oscillate the piezoelectric vibrating member in self-excited oscillation to produce a drive force. The detecting polarized portion is disposed at a portion of the piezoelectric vibrating member for undergoing maximum deformation in at least one vibration mode of oscillation of the piezoelectric vibrating member. An amplifying circuit amplifies the drive signal detected by the detecting polarized portion and inputs the amplified signal to the driving polarized portion to oscillate the piezoelectric vibrating member.

37 Claims, 27 Drawing Sheets

FIG. 29A
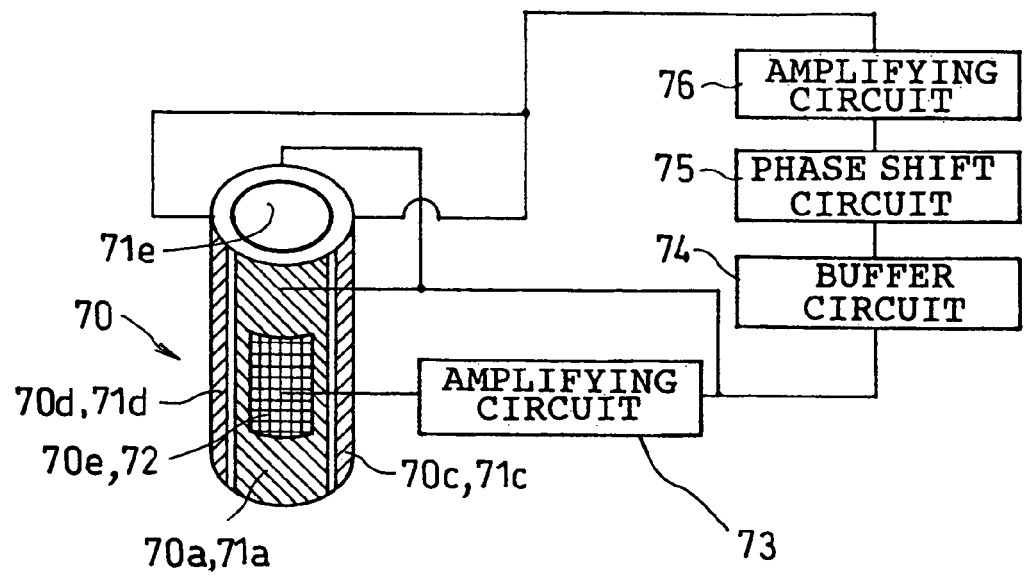
FIG. 29B
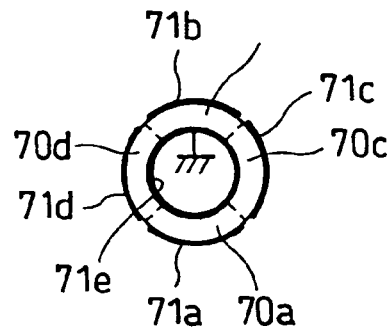
FIG. 30A
FIG. 30B  FIG. 30D
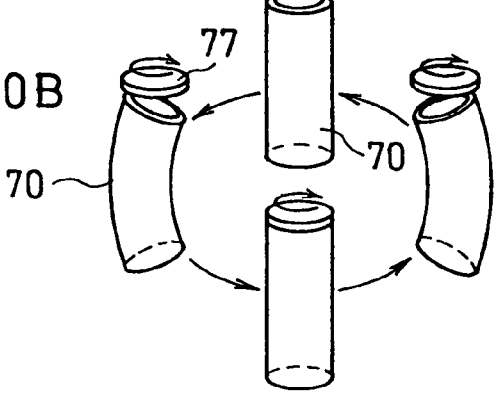
FIG. 30C

ULTRASONIC MOTOR AND ELECTRONIC APPARATUS EQUIPPED WITH ULTRASONIC MOTOR

BACKGROUND OF THE INVENTION

The present invention relates to an ultrasonic motor which is provided with a detecting polarized portion for detecting a drive signal based on oscillation in a driving polarized portion, and more particularly to an ultrasonic motor and to an electronic apparatus or appliance having the ultrasonic motor having a detecting polarized portion to detect the drive signal with a drive frequency component that is great relative to unwanted frequency components.

Recently, attention has been drawn to ultrasonic motors utilizing a piezoelectric-element having piezoelectric effects in the field of the micro-motors.

An ultrasonic motor of this type is applied with an alternating current obtained generally in an external oscillation circuit, which adopts a method of detecting a phase difference in electric current or voltage in order to trace a resonant point that varies in response to change in the external environment, including temperature and load. This method, however, renders the circuit complicated. Under such a situation, self-oscillation circuits have been placed into practical application by utilizing self-oscillation caused by a piezoelectric vibrating member itself having a piezoelectric element. The self-oscillation circuits have a feature that the structure is simple without requiring a tracing circuit. The self-oscillation circuits include a method for causing oscillation by feeding a drive signal obtained through a detecting electrode separately provided from a drive electrode back to a driving electrode through an amplifying circuit, and a method for oscillation utilizing the inductiveness at a resonant point of a piezoelectric element.

FIG. 33 shows a first conventional example of an ultrasonic motor provided with a self-oscillation circuit.

This ultrasonic motor is provided with an annular piezoelectric vibrating member 101 formed by overlaying an elastic member and a piezoelectric element processed with a predetermined polarization, a first polarized portion 102a and first electrode group 102b circumferentially formed on a surface of a piezoelectric element along the piezoelectric vibrating member 101 to have a length corresponding to a 1/2 wavelength of a circumferential standing wave caused through electrodes, a second polarized portion 103a and second electrode group 103b provided at a position deviated by a 1/4 wavelength from the first polarized portion 102a and the first electrode group 102b, respectively, a third electrode 104 provided between the second polarized portion 103a, second electrode group 103b and the first polarized portion 102a, the first electrode group 102b having a circumferential length corresponding to a 1/4 wavelength, a detecting polarized portion 105a and detecting electrode 105b positioned opposite to the third electrode 104 to have a circumferential length corresponding to a 3/4 wavelength, a first power amplifier 106 having an input end connected to the second electrode group 103b, a band pass filter amplifier 107 having an input end connected to the detecting electrode 105b and an output end connected to the first power amplifier 106, a π/2 phase shifter 108 having an input end connected to an output end of the band pass filter amplifier 107, and a second power amplifier 109 having an input end connected to an output end of the π/2 phase shifter 108 and an output end connected to the first electrode group 102b (see JP-B-6-01191).

According to the foregoing conventional ultrasonic motor, the drive signal detected through the detecting electrode 105 is extracted by the band pass filter 107 of only a principal resonant frequency component which is amplified by the first power amplifier 106 and then fed back to the second electrode group 103b. The resonant frequency component, on the other hand, is inputted to the π/2 phase shifter 108 where the phase is shifted by π/2, and then amplified by the second power amplifier 109, being fed back to the first electrode group 102b. On the piezoelectric vibrating member 101 are caused a first standing wave due to oscillation in the first polarized portion 102a and a second standing wave deviated in phase by π/2 due to oscillation in the second polarized portion 103a. Thus a traveling wave is caused in the circumferential direction of the piezoelectric vibrating member 101, thereby obtaining a drive power.

FIG. 34 shows a second conventional example of an ultrasonic motor provided with a self-oscillation circuit.

This ultrasonic motor is provided with a piezoelectric vibrating member 111 similarly to the first conventional example, a first polarized portion 112a and first electrode group 112b, a second polarized portion 113a and second electrode group 113b, a first detecting polarized portion 114a and first detecting electrode 114b formed in one of gaps between the first electrode group 112b and second electrode group 113b, a second polarized portion 116a and second detecting electrode 116b provided in the other gap 115 between the first electrode group 112b and the second electrode group 113b and adjacent to the first electrode group 112b, a third polarized portion 117a and third detecting electrode 117b provided adjacent to the second electrode group 113b, a first self-oscillation portion 119a having an input end connected to the first detecting electrode 114b and an output end connected to the first electrode group 112b, and a second self-oscillation portion 119b having an input end connected to the second detecting electrode 116b or third detecting electrode 117b through a change-over switch 118 and an output end connected to the second electrode group 113b.

According to the foregoing conventional ultrasonic motor, a signal with a π/2 or −π/2 phase deviation is detected by the first detecting electrode 114b and second detecting electrode 116b or the first detecting electrode 114b and third detecting electrode 117b. Consequently, there is no necessity of using a π/2 phase shifter as required by the first conventional ultrasonic motor (see JP-A-8-317672).

In the first conventional art, however, the detecting polarized portion 105a and the detecting electrode 105b are provided asymmetrical with respect to a loop of a first flexion vibration wave caused in the piezoelectric vibrating member 101 through the first electrode group 102b. This is also true for the positional relationship of a second flexion vibrating wave caused in the piezoelectric vibrating member 101 through the second electrode group 103b. If in this manner the detecting polarized portion 105a and the detecting electrode 105b are arranged in an asymmetrical relationship with respect to a loop of the flexion vibrating wave, the detecting polarized portion 105a deforms in an asymmetrical fashion. The drive signal detected through the detecting electrode 105b contains unwanted frequency components due to spurious vibrations, besides a drive-mode frequency component. The drive-mode frequency component signal obtained is decreased, resulting in instability of self-oscillation.

Meanwhile, because the piezoelectric vibrating member 101 is oscillated by two signals that are different in phase, the phase shift circuit 108 has an increased load and, on the other hand, the gain of self-oscillation loop lowers. This results in instability of oscillation or impossibility of oscillation as the case may be.

In the second conventional ultrasonic motor, on the other hand, the first detecting polarized portion 114a and the first detecting electrode 114b are arranged intermediate between a node and a loop of a first flexion vibrating wave caused in the piezoelectric vibrating member 111 through the first polarized portion 112a. Further, the second detecting electrode 116b and the third detecting electrode 117b are also provided intermediate between a node and loop of a second flexion vibrating wave caused in the piezoelectric vibrating member 111 through the second polarized portion 113a. Due to this, spurious oscillation is also liable to occur wherein there is a tendency of decreasing a desired frequency component, resulting in instability of self-oscillation.

Meanwhile, where the detecting polarized portion and the detecting electrode are provided in a part of the driving polarized portion, if the detecting polarized portion and detecting electrode are decreased in area, it is generally impossible to detect a drive signal great in magnitude. Conversely, if the detecting polarized portion and detecting electrode are made broad in area, the driving polarized portion is decreased in area, resulting in a problem of incurring a decrease in the drive force.

SUMMARY OF THE INVENTION

It is an object of the present invention to provide an ultrasonic motor and an electronic appliance with an ultrasonic motor which is capable of detecting a drive signal with a drive frequency component that is great relative to unwanted frequency components and stabilizing self-oscillation, reducing the burden on a phase shift circuit and maintaining a self-oscillation loop gain, and extracting a drive signal great in magnitude and maintaining drive force.

According to the present invention, there is provided an ultrasonic motor having a piezoelectric vibrating member having a driving polarized portion and a detecting polarized portion wherein the piezoelectric vibrating member is self-oscillated based on an output signal of the detecting polarized portion to obtain a drive force. The detecting polarized portion is provided at a position including a portion where deformation assumes a maximum in at least one vibration mode of oscillation in the piezoelectric vibrating member.

With this structure, the detecting polarized portion deform like the driving polarized portion thus detecting a drive signal. In particular, the driving polarized portion greatly deflects to detect a signal great in drive frequency because it has as a center a loop of a flexion vibration wave. Also, the drive frequency signal is detected large relative to unwanted frequencies (unwanted vibrating mode) because of deformation symmetrical about the center.

In other words, a detection signal is obtained that is great with respect only to a desired oscillation mode due to oscillation by the driving polarized portion.

That is, the detected drive signal includes a drive frequency signal great in magnitude and unwanted frequency components sufficiently reduced.

Therefore, the piezoelectric vibrating member is suppressed in spurious vibration and stabilized in self-oscillation.

There is also provided an ultrasonic motor having a piezoelectric vibrating member having a first driving polarized portion to cause a first flexion vibration wave and a second driving polarized portion to cause a second flexion vibration wave deviated in phase with respect to the first flexion vibration wave A detecting polarized portion is provided symmetrical about a loop of one of the first flexion vibration wave and the second flexion vibration wave to detect a drive signal based on oscillation in the driving polarized portion causing the one flexion vibration wave.

With this structure, a drive signal with a drive frequency as a main component is detected through the detecting polarized portion based on oscillation in the one polarized portion. This drive signal is amplified and fed back to the one driving polarized portion thereby causing the driving polarized portion to self-oscillate. On the other hand, the drive signal with phase shift is inputted to the other driving polarized portion. Elliptic vibration is caused in the piezoelectric vibrating member due to the first flexion vibration wave and the second flexion vibration wave that are deviated in phase from each other, thus obtaining a drive force.

The ultrasonic motor may further include an amplifying circuit for amplifying the drive signal detected by the detecting polarized portion and a phase shift circuit for shifting a phase of the drive signal amplified by the amplifying circuit, wherein the drive signal amplified by the amplifying circuit is fed back to the driving polarized portion that the drive signal has been detected by the driving polarized portion while the drive signal shifted in phase by the phase shift circuit is inputted to the other driving polarized portion.

With this structure, the drive signal detected through the detecting polarized portion is amplified by the amplifying circuit. One of the amplified drive signal is fed back to the driving polarized portion that the drive signal has been detected by the detecting polarized portion. The other of the drive signal is shifted in phase by the phase shift circuit and inputted to the other driving polarized portion. Elliptic vibration is caused in the piezoelectric vibrating member due to a first flexion vibration wave and a second flexion vibration wave that are deviated in phase from each other, thus obtaining a drive force.

Also, there is provided an ultrasonic motor having a piezoelectric vibrating member having a first driving polarized portion for causing a first flexion vibrating wave and a second driving polarized portion for causing a second flexion vibration wave deviated in phase with respect to the first flexion vibration wave to self-oscillate the piezoelectric vibrating member, thereby obtaining a drive force. The ultrasonic motor comprising a first detecting polarized portion provided symmetrical about a loop of the first flexion vibrating wave to detect a drive signal based on oscillation on the first driving polarized portion; a second detecting polarized portion provided symmetrical about a loop of the first flexion vibrating wave to detect a drive signal based on oscillation on the second driving polarized portion; a first switching circuit for switching to one of the first detecting polarized portion and the second polarized portion; an amplifying circuit for amplifying the drive signal detected by one of the detecting polarized portions to which the first switching circuit switches; a phase shift circuit for shifting a phase of the drive signal amplified by the amplifying circuit; a second switching circuit for feeding the drive signal amplified by the amplifying circuit back to the driving polarized portion that the drive signal has been detected by the one detecting polarized portion; a third switching circuit for inputting the drive signal sifted in phase by the phase shift circuit to the other driving polarized portion; whereby elliptic vibration is caused on the piezoelectric vibrating member due to the first flexion vibration wave and the second flexion vibration wave, and the elliptic oscillation is reversed in rotational direction by switching the first switching circuit, the second switching circuit and the third switching circuit.

With this structure, a drive signal with a drive frequency as a main component is detected through the first detecting polarized portion based on oscillation in the first driving polarized portion. This drive signal is inputted to the amplifying circuit by the first switching circuit, and then amplified by the amplifying circuit. One part of the amplified signal is inputted to the first driving polarized portion by the second switching circuit to cause a first vibration wave in the piezoelectric vibrating member.

The other part of the drive signal is shifted in phase by the phase shift circuit and inputted to the second driving polarized portion by the third switching circuit, causing a second flexion vibration wave in the piezoelectric vibration member.

Elliptical oscillation is caused in the piezoelectric vibrating member due to a first flexion vibration wave and a second flexion vibration wave that are deviated in phase from each other, thus obtaining a drive force.

On the other hand, a drive signal is detected through the second detecting polarized portion based on oscillation in the second driving polarized portion. By switching the first, second and third switching circuits, the elliptical vibration is reversed in rotational direction thus obtaining a drive force in a reverse direction.

There is also provided an ultrasonic motor having a piezoelectric vibrating member having a first driving polarized portion for causing a stretching vibration wave and a second driving polarized portion for causing a flexion vibrating wave, to self-oscillate the piezoelectric vibrating member thereby obtaining a drive force A detecting polarized portion is provided symmetrical about a loop of the flexion vibration wave on the piezoelectric vibrating member to detect a drive signal based on oscillation in the second driving polarized portion.

With this structure, the detecting polarized portion largely deforms at a loop of a flexion vibration wave to detect a signal great in drive frequencies. The detected drive signal has a large drive frequency component relative to unwanted frequency components due to symmetrical deformation about a center. One part of this drive signal is fed back to the second driving polarized portion, while the other part of the drive signal is inputted to the first driving polarized portion. Elliptical vibration is caused in the piezoelectric vibrating member due to a stretching vibration wave and a flexion vibration wave, thus obtaining a drive force.

The detecting polarized portion may be provided symmetrical about a node of the stretching vibrating wave in place of the loop of the flexion vibration wave to thereby detect the drive signal based on oscillation in the first driving polarized portion.

With this structure, the detecting polarized portion is at a position greatest in deformation and deforms symmetrical about the center thereby detecting a drive signal with a drive frequency component great relative to unwanted frequency components. One part of this drive signal is fed back to the first driving polarized portion while the other part of the drive signal is inputted to the second driving polarized portion. Elliptical vibration is caused in the piezoelectric vibrating member due to a stretching vibration wave and a flexion vibration wave thereby obtaining a drive force.

The ultrasonic motor may further include an amplifying circuit to amplify the drive signal detected by the detecting polarized portion, so that the drive signal amplified by the amplifying circuit is fed back to one driving polarized portion that the drive signal is detected by the detecting polarized portion while the amplified drive signal is inputted to the other driving polarized portion.

With this structure, the drive signal amplified by the amplifying circuit is fed back to the driving polarized portion that the drive signal has been detected by the detecting polarized portion while inputted to the other driving polarized portion.

A phase shift circuit for shifting a phase of the drive signal amplified by the amplifying circuit may be provided between the amplifying circuit and the other driving polarized portion.

With this structure, the stretching vibration wave and the flexion vibration wave are deviated in phase to change the form of the elliptical vibration thereby adjusting a drive force.

The piezoelectric vibrating element may be in a form of a cylinder and an end face of the cylinder at a maximum displacement point is moved by the first flexion vibrating wave and the second flexion vibrating wave. Here, the cylinder form includes a cylindrical form and a hollow cylindrical form.

With this structure, the piezoelectric vibrating member cylinder at its end face moves a maximum displacement point at the cylinder end face, due to the first flexion vibration wave and the second flexion vibration wave. The maximum displacement point elliptically vibrates thus obtaining drive force.

Also, there is provided an ultrasonic motor provided with a piezoelectric vibrating member having a driving polarized portion to be oscillated in vertical vibration to cause the piezoelectric vibrating member to self-vibrate thereby obtaining drive force, the ultrasonic motor characterized in that a detecting polarized portion is provided in one part of the driving polarized portion to detect a drive signal based on oscillation in the driving polarized portion.

With this structure, the detecting polarized portion equally deforms in a vertical vibrational direction alike the driving polarized portion to detect a drive signal with a drive frequency component great relative to unwanted frequency components.

The detecting polarized portion may be separately provided in a vertical vibrating direction of the driving polarized portion in place of the one part of the driving polarized portion.

With this structure, the detecting polarized portion is overlaid in the vertical vibrational direction of the driving polarized portion and accordingly deforms in the vertical vibrating direction like the driving polarized portion, thereby detecting a drive signal with a drive frequency component relative to unwanted frequency components. Also, the detection area is sufficiently secured without reducing the oscillation area in the driving polarized portion, thereby maintaining a drive force and extracting a detection signal great in magnitude.

The detecting polarized portion may be provided in one part of the driving polarized portion that has detected the drive signal.

With this structure, the detecting polarized portion utilizes a part of the driving polarized portion, thereby reducing the number of parts and reducing the apparatus size.

The detecting polarized portion may be separately provided from the driving polarized portion that has detected the drive signal.

With this structure, the detecting polarized portion is separately provided to sufficiently secure the detecting area without reducing the oscillation area in the driving polarized portion. Accordingly, a drive force is maintained and a great-magnitude detection signal is extracted. Also, the detecting polarized portion may be utilize a driving electrode not used in driving. With this structure, the utilization of a driving polarized portion not used in driving makes it possible to sufficiently secure the detecting area without reducing the oscillation area in the driving polarized portion. This maintains a drive force and extracts a great detection signal.

The detecting polarized portion and the driving polarized portion may be formed integral in an overlying form.

With this structure, the detecting polarized portion and the driving polarized portion are integrally formed without joining through adhesion, bolt tightening or the like. Accordingly, there is no energy loss in the junction, and the motor efficiency is increased. Furthermore, it becomes possible to suppress against occurrence of manufacture variation and increase in the number of parts.

A buffer circuit may be provided between the amplifying circuit and the phase shift circuit which is high in input impedance but low in output impedance.

With this structure, a small amount of the amplified signal is outputted to the phase shift circuit by the buffer circuit, while the signal amount within the self-oscillation loop is maintained. Accordingly, the load on the phase shift circuit can be decreased and the gain of the self-oscillation loop be maintained. A stable self-oscillation drive can be realized for an ultrasonic motor using two drive signals different in phase.

A second amplifying circuit may be provided between the phase shift circuit and the other driving polarized portion to amplify the drive signal shifted in phase by the phase shift circuit.

With this structure, the signal shifted in phase by the phase shift circuit is again amplified to bring one vibration wave and the other vibration wave into nearly the same in magnitude to adjust the elliptical vibration caused on the piezoelectric vibrating member, thus adjusting the drive force.

An electronic appliance can be constituted by being provided with the ultrasonic motor.

With this structure, it is possible to realize an electronic appliance having an ultrasonic motor the according to the present invention.

BRIEF DESCRIPTION OF THE DRAWINGS

FIGS. 29A–29B show an ultrasonic motor according to Embodiment 6 to which the invention is applied, wherein FIG. 29A shows a piezoelectric vibrating member perspective structure with a block diagram of a drive circuit and FIG. 29B shows a plan structure of the piezoelectric vibrating member;

FIGS. 30A–30D show the operation of the piezoelectric vibrating member of the ultrasonic motor of FIG. 29.

FIGS. 31A–31B show an ultrasonic motor according to Embodiment 7 to which the invention is applied, wherein FIG. 31A is a piezoelectric vibrating member perspective structure and FIG. 31B shows a block diagram of a drive circuit;

DETAILED DESCRIPTION OF THE PREFERRED EMBODIMENTS

Preferred embodiments according to the present invention will be explained with reference to FIG. 1 to FIG. 32.

Embodiment 1

Figure 1:
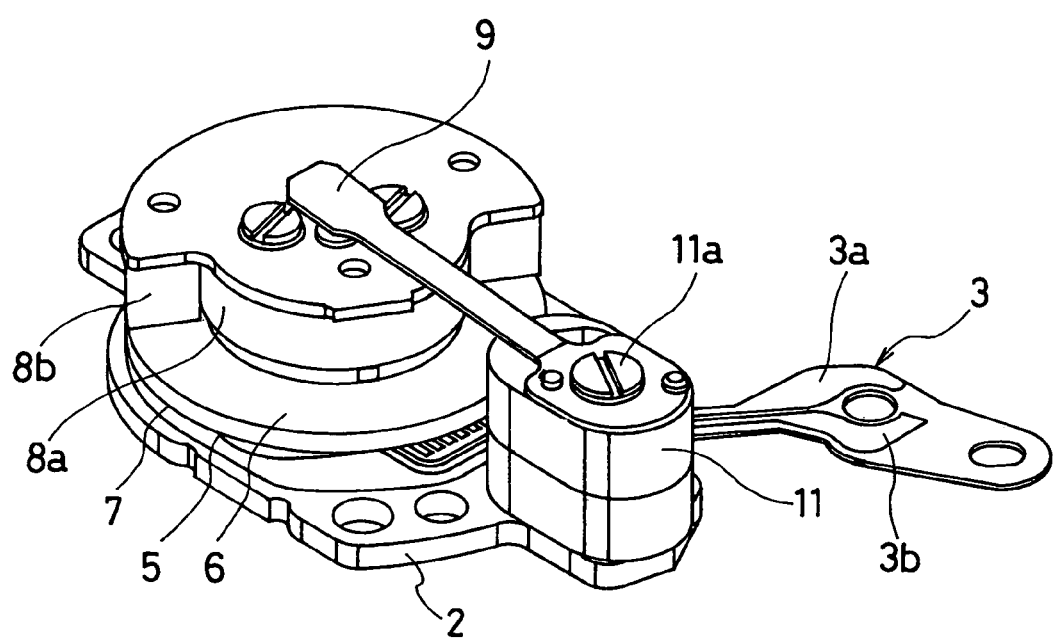
FIG. 1 is a perspective view of an ultrasonic motor according to Embodiment 1 of the present invention.
Figure 2:
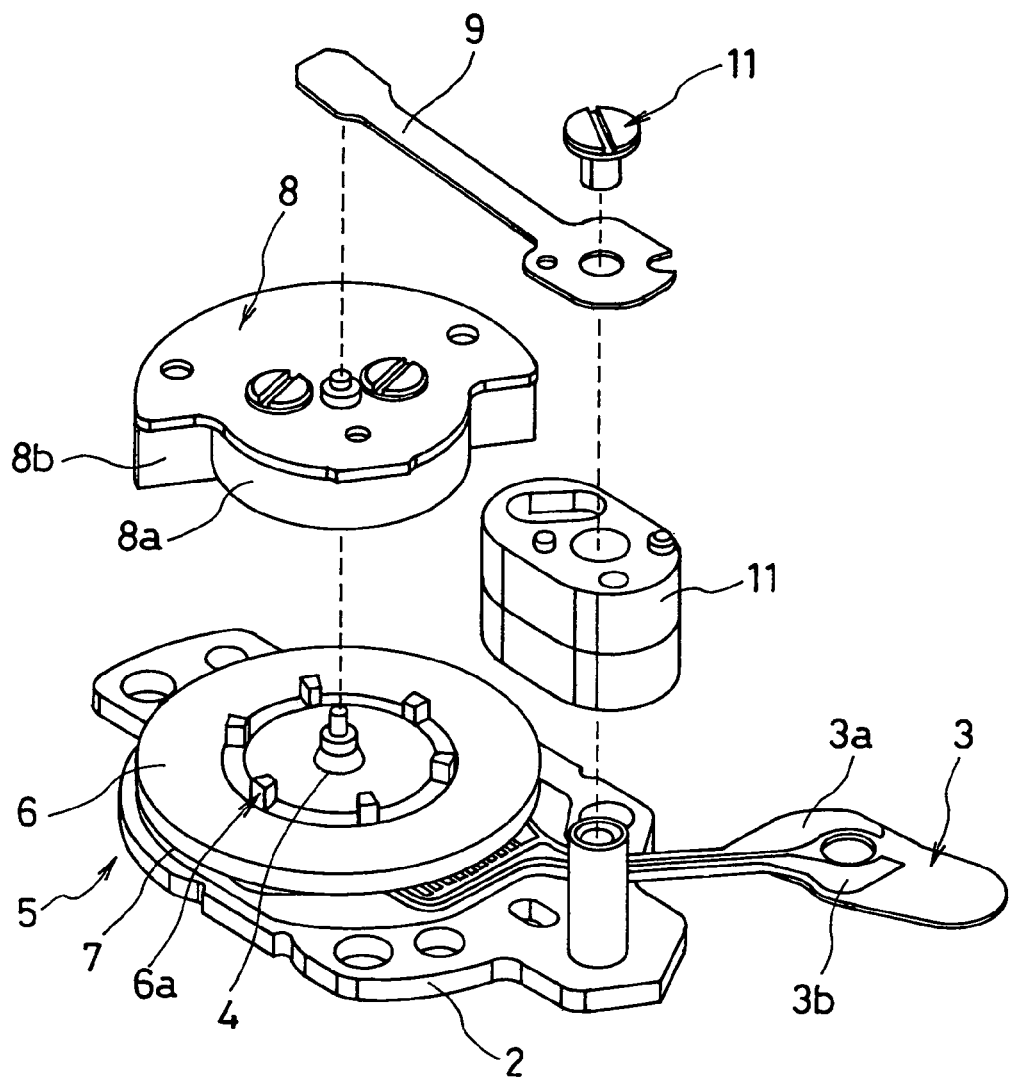
FIG. 2 is an exploded perspective view of the ultrasonic motor of FIG. 1.

FIG. 1 is a perspective view of an ultrasonic motor according to Embodiment 1 to which the present invention is applied. FIG. 2 shows an exploded perspective view of the ultrasonic motor. FIG. 3 is an illustrative view showing a plan structure showing an electrode pattern 12, arrangement of projections 6a and operation of the projections 6a.

The ultrasonic motor comprises, as shown in FIG. 1 and FIG. 2, a support plate 2, a piezoelectric element lead 3, a central shaft 4 provided at a center of the support plate 2, a piezoelectric element vibrating member 5 fixed on the central shaft 4, a rotor unit 8 abutting against the piezoelectric vibrating member 5, a press spring 9 abutting against the rotor unit 8, and a press spring seat 11 for installing the press spring 9.

Here, the piezoelectric lead 3 is laid with a first lead 3a and second lead 3b formed of gold, copper or the like on a substrate of polyimide or the like.

Figure 3A:
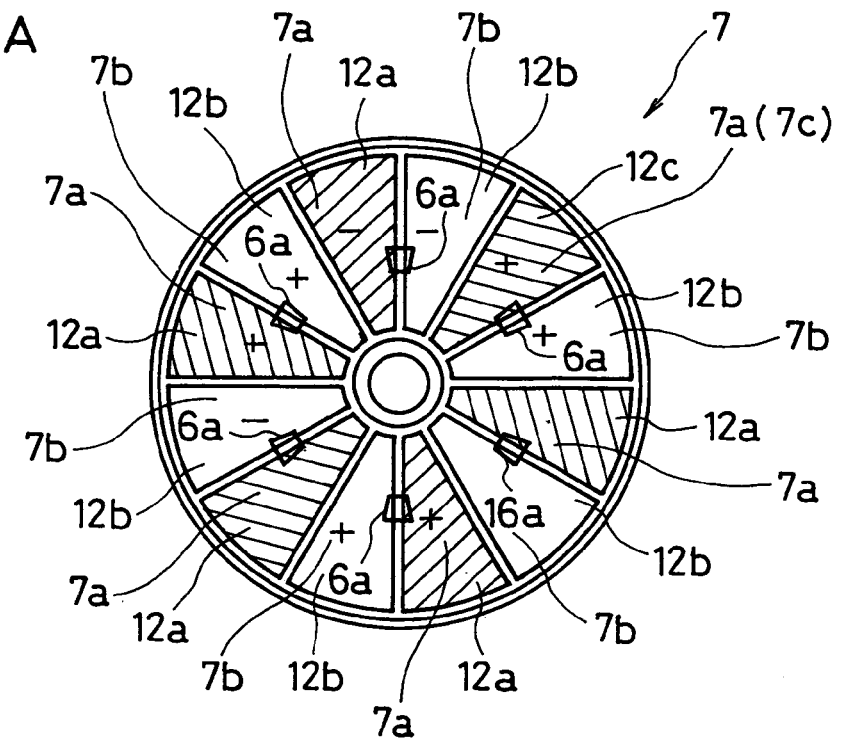
FIGS. 3A–3C are showing a plan structure, projection arrangement and projection operation of an electrode pattern of the ultrasonic motor of FIG. 1.
Figure 3B:
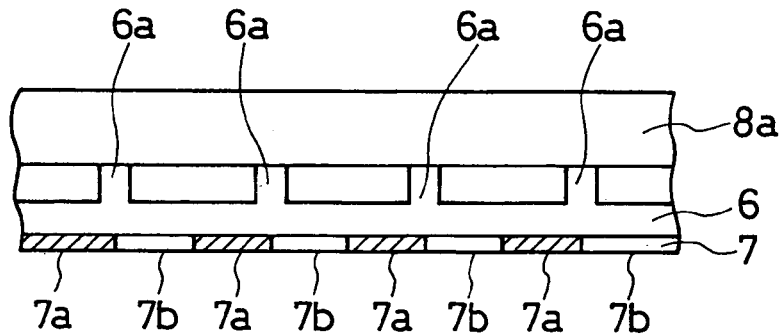

The piezoelectric vibrating member 5 is structured by an elastic member 6 and a piezoelectric element 7 bonded on the elastic member 6. The elastic member 6 is a disc member formed of an elastic material, for example, of aluminum alloy, stainless steel or brass. As shown in FIGS. 3A and 3B, this disc member is provided, on its inner surface, with square-formed projections 6a, 6a, 6a, 6a, 6a, 6a, at every other positions of boundaries between divisional portions of the piezoelectric element 7, i.e., corresponding to intermediate positions between the node and loop of three flexion vibrating waves circumferentially caused.

The piezoelectric element 7 uses, for example, barium titanate, lead titanate, lithium niobate or lithium tantalate, and formed generally in a disc form corresponding to the elastic member 6.

As shown in FIG. 3A, this disc member is equally divided into 12 fan shapes each corresponding to a 1/4 wavelength of three wavelength of flexion vibrating waves circumferentially caused. The every other divisional portions constitute one set of polarized portions to provide first polarized portions 7a, 7a, 7a, 7a, 7a, 7a and second polarized portions 7b, 7b, 7b, 7b, 7b, 7b as driving polarized portions of the invention. The divisional portions of each polarized portion 7a ... 7a, 7b ... 7b are polarized in opposite directions to each other with respect to its thickness direction. Here, the polarization is made by applying a voltage higher than a coercive electric field to provide a positive direction (+) with a negative potential given to a joining surface with the elastic member 6 and a positive potential to an opposite surface to the same joining surface. Also, in order to provide a reverse direction (−) a voltage higher than the coercive electric field is applied with a positive potential given to the joining surface with the elastic member 6 and a positive potential to the opposite surface to the joining surface.

Figure 4A:
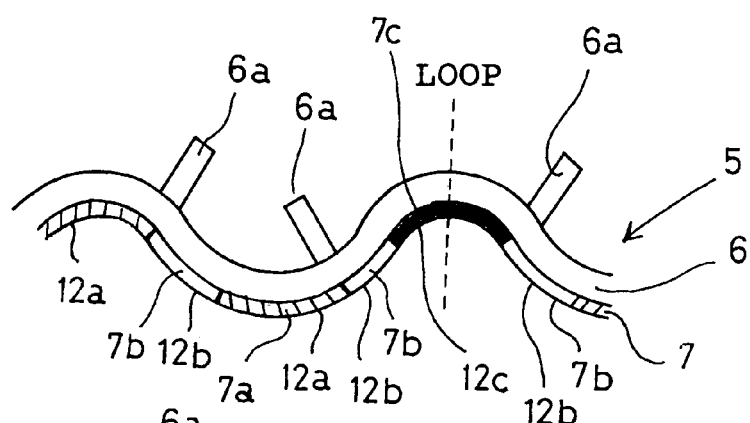
FIGS. 4A–4B are a views showing an arrangement of a detecting polarized portion of the ultrasonic motor of FIG. 1, wherein A is an arrangement in a part of a first detecting polarized portion and B is a case of provision correspondingly to the first polarized portion.
Figure 4B:
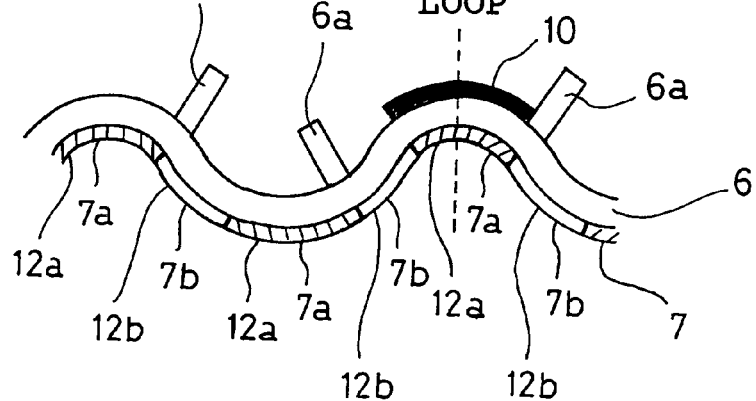
Figure 5A:
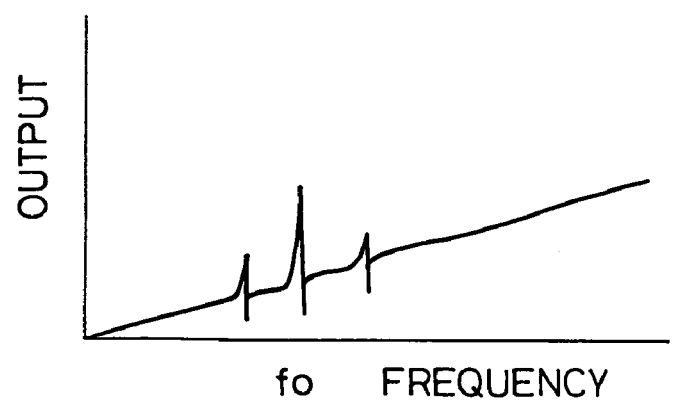
FIGS. 5A–5B show a frequency component of a drive signal detected by the detecting polarized portion of the ultrasonic motor of FIG. 1.
Figure 5B:
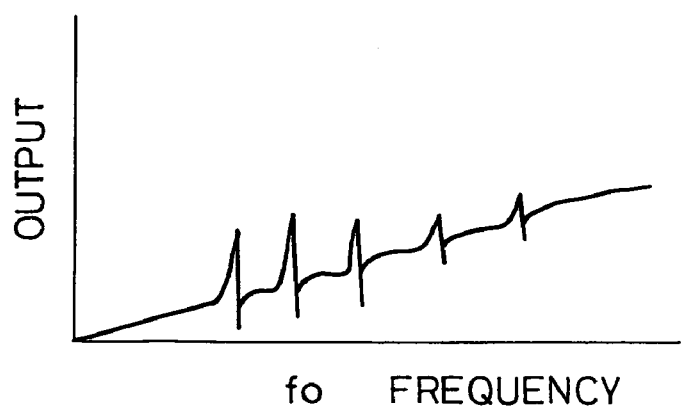

FIG. 4 shows an arrangement relation of a detecting polarized portion 7c of the piezoelectric vibrating member 5, while FIGS. 5A–5B show a frequency component of a drive signal detected by the detecting polarized portion 7c.

The first polarized portions 7a ... 7a are partly utilized as a detecting polarized portion 7c.

This detecting polarized portion 7c is provided symmetric about a loop of a flexion vibrating wave as shown in FIG. 4A, as the first polarized portions 7a ... 7a are oscillated to cause flexion vibrating wave in the elastic member 6.

With this arrangement, the detecting polarized portion 7c deforms in a similar fashion to the first polarized portion 7a wherein the deformation is great and symmetric about its center, as shown in FIG. 5A. Accordingly, it detects a drive signal that is great in drive frequency f0 component relative to unwanted frequency components. That is, the drive signal contains much drive frequency f0 component and less unwanted frequency component thus improving detection sensitivity of the drive frequency f0 component.

On the other hand, if the detecting polarized portion 7c is arranged asymmetric about a loop of a flexion vibrating wave as shown in FIG. 5B, distortion in a vibration mode of an unwanted frequency component is liable to occur for the drive frequency f0. Due to this, the drive frequency f0 detection sensibility lowers and spurious vibration becomes easy to detect.

Incidentally, as a modification, another detecting polarized portion 10 and detecting electrode may be provided on the elastic member 6 side at an opposite position to the first polarized portion 7a in a symmetric manner about a loop of a flexion vibrating wave as a center, as shown in FIG. 4B. This detecting polarized portion 10 uses, for example, the same material as the piezoelectric element 7 and is polarized in a same direction as the opposite first polarized portion 7a. This portion deforms similarly to the first polarized portion 7a to detect as a main component a driving frequency f0.

It is also possible, though not shown, to electrode-form a driving polarized portion and a detecting polarizing portion and then overlap and sinter them into one body. In this case, because the detecting polarized portion can have a polarized portion/detecting portion in a same shape and position as the driving polarized portion, it is possible to obtain a signal that is high in sensitivity for a driving signal and less spurious.

With this arrangement, a detection area is secured without reduction in oscillation area of the first polarized portion 7a thus maintaining a drive force and providing a great drive signal.

Also, generally fan-formed electrodes 12 are formed by means of evaporation or the like, correspondingly to the divisional portions, on the opposite surface of the elastic member 6 to the piezoelectric element 7, as shown in FIG. 3A. Thus, first electrode patterns 12a, 12a, 12a, 12a 12a, 12a are formed corresponding to the first polarized portions 7a ... 7a, second electrode patterns 12b, 12b, 12b, 12b, 12b, 12b are formed corresponding to the second polarized portions 7b ... 7b, and a detecting electrode 12c is formed corresponding to the detecting polarized portion 7c.

Also, the first electrode patterns 12a ... 12a are mutually short-circuited through leads and are connected to a first lead 3a of the piezoelectric element lead 3, while the second electrode pattern 12b ... 12b are mutually short-circuited through leads and are connected to a second lead 3b. On the other hand, the surface to be joined with the elastic member 6 is formed with an electrode 12d over its entire surface.

Figure 3C:
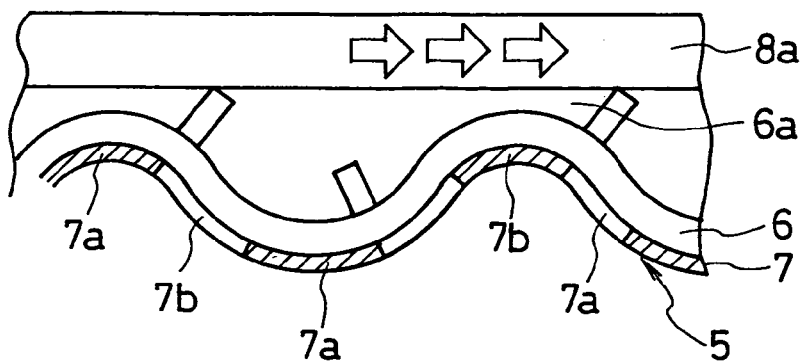

To drive the rotor unit 8, a signal is inputted to the first electrode patterns 12a ... 12a to cause oscillation as shown in FIG. 3C so that the elastic member 6 is flexion-vibrated to produce three wavelengths of flexion vibrating waves in the circumferential direction. At this time, the projections 6a elliptically oscillated clockwise to apply a counterclockwise frictional force to the rotor 8a, rotating the rotor unit 8 counterclockwise.

Incidentally, when driving clockwise, an oscillation signal as above is inputted to the second electrode patterns 12b . . . 12b to cause them to oscillate, producing flexion vibrating waves different in phase by 90 degrees from the above flexion vibrating waves in the elastic member 6. Thereupon the projections 6a elliptically vibrate counterclockwise to apply a clockwise frictional force to the rotor 8a, rotating the rotor unit 8 clockwise.

The rotor unit 8, for example, has a rotor 8a and a weight 8b outwardly contacted with the rotor 8a, as shown in FIG. 1 and FIG. 2. The rotor 8a is formed, for example, by a disc member of a wear-resistive engineering plastic, and has at its top face a pivot against which the press spring 9 is to be abutted. The weight 8b is formed of tungsten or the like to increase the inertia moment of the rotor unit 8, turning the rotation of the rotor 8a into centrifugal-force vibration.

The press spring 9 is a leaf spring formed into a predetermined shape, which applies a pressure force to the pivot of the rotor unit 8 thus applying pressure onto the rotor 8a and hence the projections 6a of the elastic member 6.

Now a drive circuit for the present ultrasonic motor is explained.

Figure 6A:
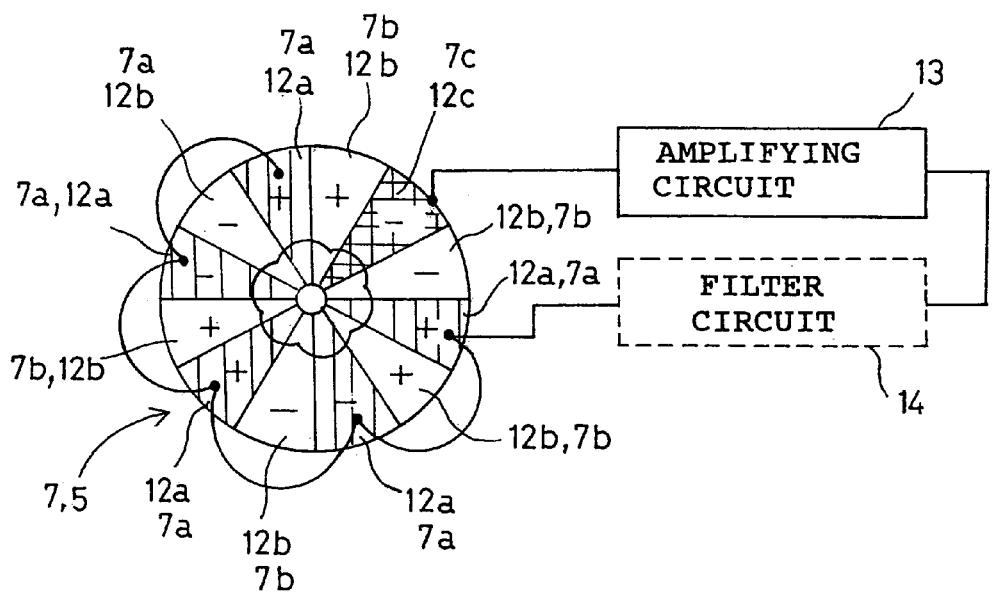
FIGS. 6A–6B show block diagrams of a drive circuit of the ultrasonic motor of FIG. 1.
Figure 6B:
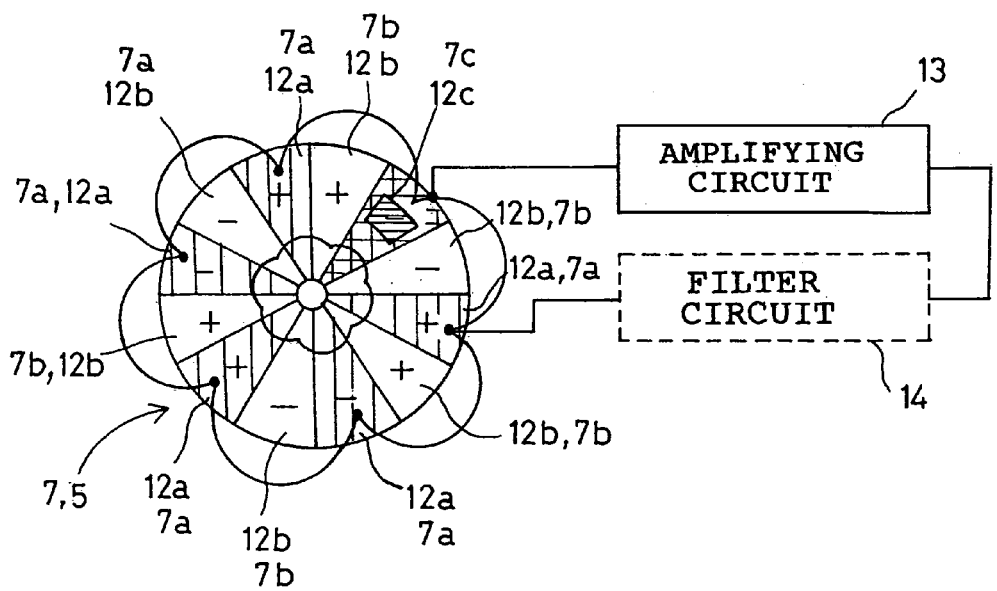
Figure 7:
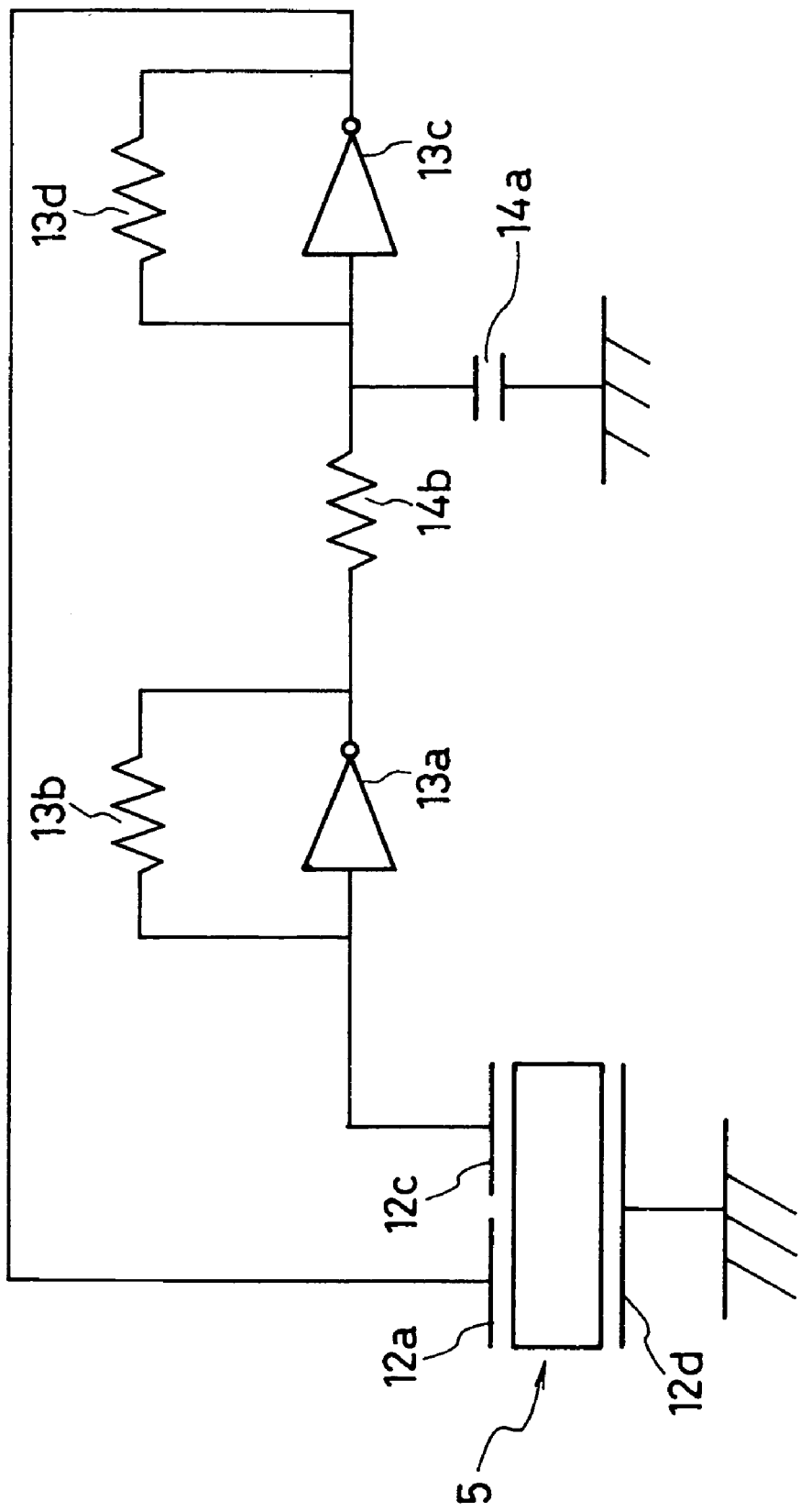
FIG. 7 shows a diagram of a drive circuit of the ultrasonic motor of FIG. 1.

FIGS. 6A–6B show a block diagram of a drive circuit for the ultrasonic motor, while FIG. 7 is an exemplary diagram showing the drive circuit of the ultrasonic motor.

This drive circuit is formed by a piezoelectric vibrating member 5, an amplifying circuit 13 and a filter circuit 14, as shown in FIGS. 6A–6B.

The amplifying circuit 13 is formed, as shown in FIG. 7, an inverter 13a having an input end connected to a detecting electrode 12c, a resistor 13b connected in parallel with the inverter 13a, an inverter 13c, and a resistor 13d connected in parallel with the inverter 13c.

The filter circuit 14 is formed by a resistor 14b having one end connected to an inverted output terminal of the inverter 13a and the other end connected to an input terminal of the inverter 13c, and a capacitor 14c having one end connected to the resistor 14b and the other end grounded, forming a self-oscillating circuit.

The inverter 13a amplifies a signal detected by the detecting electrode 12c. The resistor 13b feeds back the drive signal thus amplified to the input terminal of the inverter 13a, thereby determining an operation point. The capacitor 14a and the resistor 14b remove unwanted frequency components other than a drive frequency component f0 from the amplified drive signal. The drive signal is then amplified by an amplifying circuit formed by the inverter 13c and the resistor 13d, and applied to the driving electrode 12a.

Now the operation of the ultrasonic motor is explained based on FIGS. 6A–6B and FIG. 7.

The detecting polarized portion 7c deforms similarly to the first polarized portion 7a so that the detecting electrode 12c can detect a drive signal that is caused by a piezoelectric effect due to the deformation in the detecting polarized portion 7c.

At this time, the detecting polarized portion 7c deforms similarly to the first polarized portion 7a, and deforms greatly because it has a loop of a flexion vibrating wave in a symmetric fashion with respect to the center. Accordingly, it detects a drive signal having a great drive frequency f0 component as compared with the unwanted frequency component.

The drive signal having the drive frequency f0 as main component is inputted to the non-inverted input end of the inverter 13a where it is inversion-amplified. The inversion-amplified drive signal is removed of unwanted frequency components by the capacitor 14a, 14c and the resistor 14b, and further inversion-amplified by the inverter 13c, then being inputted to the one electrode patterns 12a . . . 12a.

The first polarized portions 7a . . . 7a of the piezoelectric element 7 are oscillated by the drive signal, and the elastic member 6 is flexionally vibrated to produce three wavelengths of flectional vibrating waves. The projections 6a on the elastic member 6 elliptically vibrates in the clockwise direction and applies a frictional force to the rotor 8a, thereby rotating the rotor unit 8 counterclockwise.

Thereupon the drive signal with the main component drive frequency f0 causes, at the drive frequency f0, the first polarized portions 7a . . . 7a of the piezoelectric element 7 to largely oscillate, wherein the first polarized portions 7a . . . 7a are almost free from oscillation by unwanted frequencies. Thus spurious vibration is suppressed and self-oscillation is stabilized.

Figure 8A:
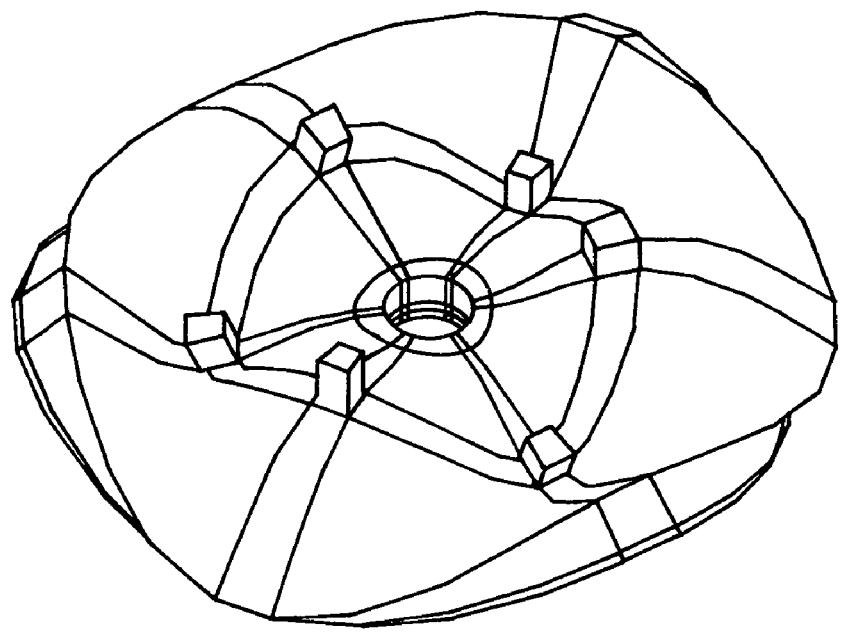
FIGS. 8A–8B are views showing an example of a piezoelectric vibrating member vibration mode and a detecting polarized portion arrangement.
Figure 8B:
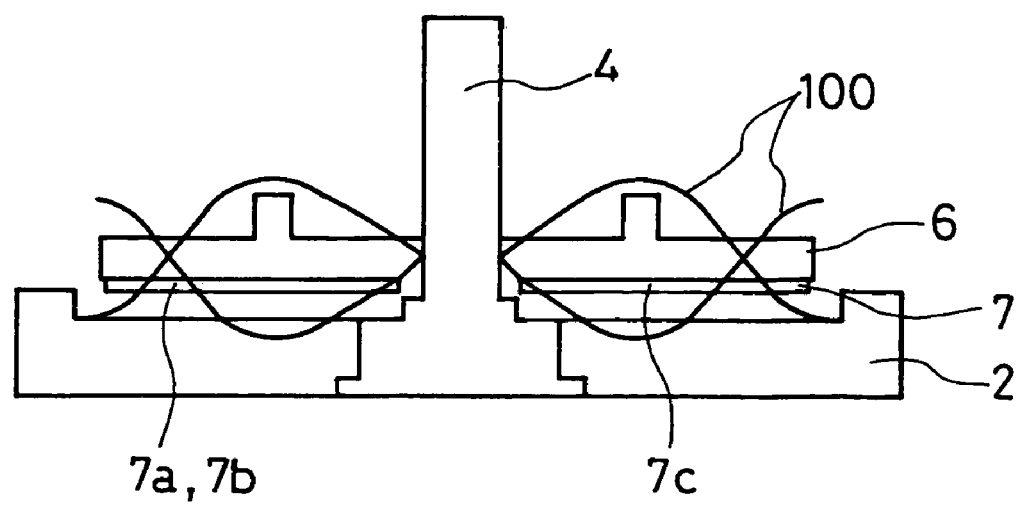

Meanwhile, where the detecting polarized portion 7C oscillates in a vibration mode with a nodal circle with respect to a diametrical direction as shown in FIG. 8A, the detecting polarized portion 7c has a maximum flectional displacement deformation with respect to a circumferential direction as shown in FIG. 6B and FIG. 8B. The vibration with an objective frequency component only is extracted greatly by the provision only close to a position including a portion that the flectional displacement 100 with respect to the diametrical direction becomes maximum, that is, by the provision at a position that the deformation becomes maximum in the objective vibration mode, thereby suppressing spurious vibration and stabilizing self-oscillation.

In particular, other vibration modes possessing the same order with respect to the circumferential direction are effective to suppress displacement out of and in the plane. Accordingly, the shape of the detecting polarized portion in FIG. 6A is preferred for oscillating in a first-order vibration mode without a nodal circle with respect to the diametrical direction.

From the above, the present embodiment detects a signal having a drive frequency f0 as a main component, wherein the first polarized portions 7a . . . 7a oscillate at the drive frequency f0 while they are almost free from oscillating at unwanted frequencies. Thus spurious-vibration is suppressed and self-oscillation is stabilized.

The detecting polarized portion 7c utilizes a part of the first polarized portion 7a, thus reducing the number of parts and hence simplifying the apparatus structure.

Meanwhile, because the detecting polarized portion 10 secures a sufficient detecting area without reducing the area of oscillation in the first polarized portion 7a, the drive force is maintained and a great drive signal can be extracted.

The structure of the drive circuit is not limited to FIG. 7. The drive signal may be outputted to the driving polarized portion 7a such that an amplifying circuit is at least provided to amplify an output signal of the detecting polarized portion 7c to satisfy a condition for causing self-oscillation.

Here, the oscillating condition is to receive a signal from the detecting polarized portion 7c and apply at least a drive signal outputted from a circuit formed by an amplifying circuit to the driving polarized portion 7a wherein a gain of a loop making an oscillation circuit outputting again at the detecting polarized portion 7c is 1 or greater with an equal phase.

Embodiment 2

Figure 9:
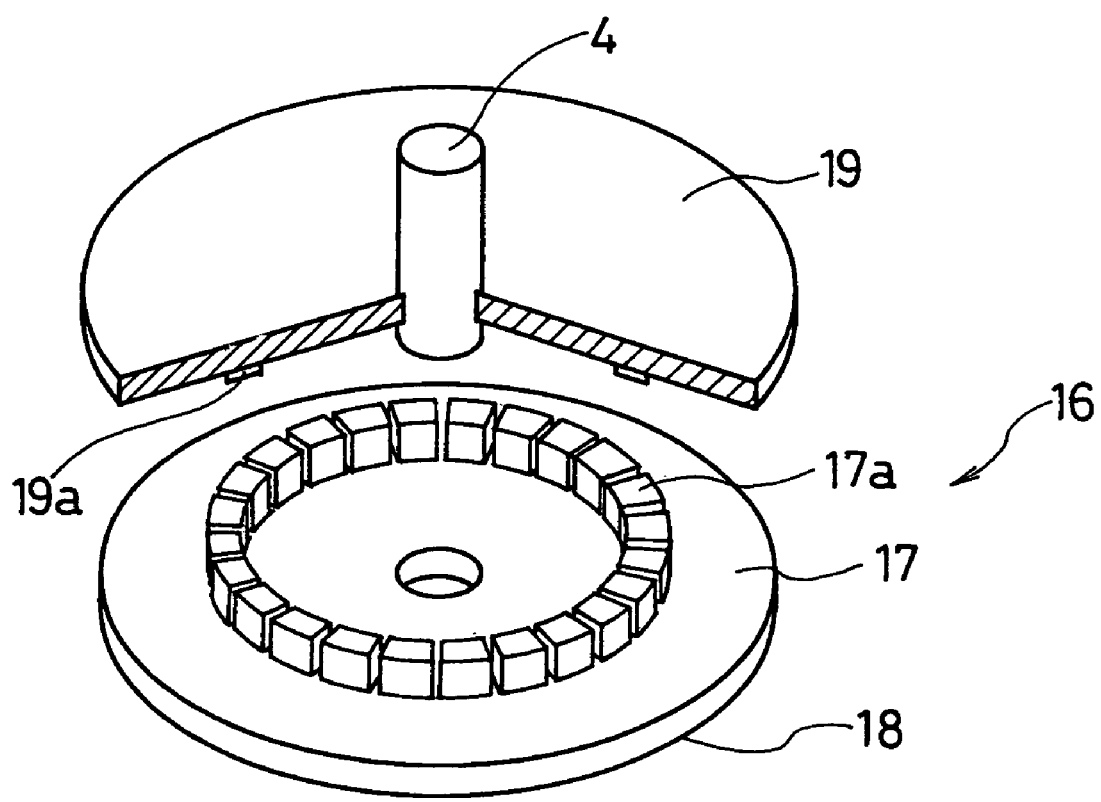
FIG. 9 is a perspective view of an essential part of an ultrasonic motor according to Embodiment 2 of the present invention.
Figure 10:
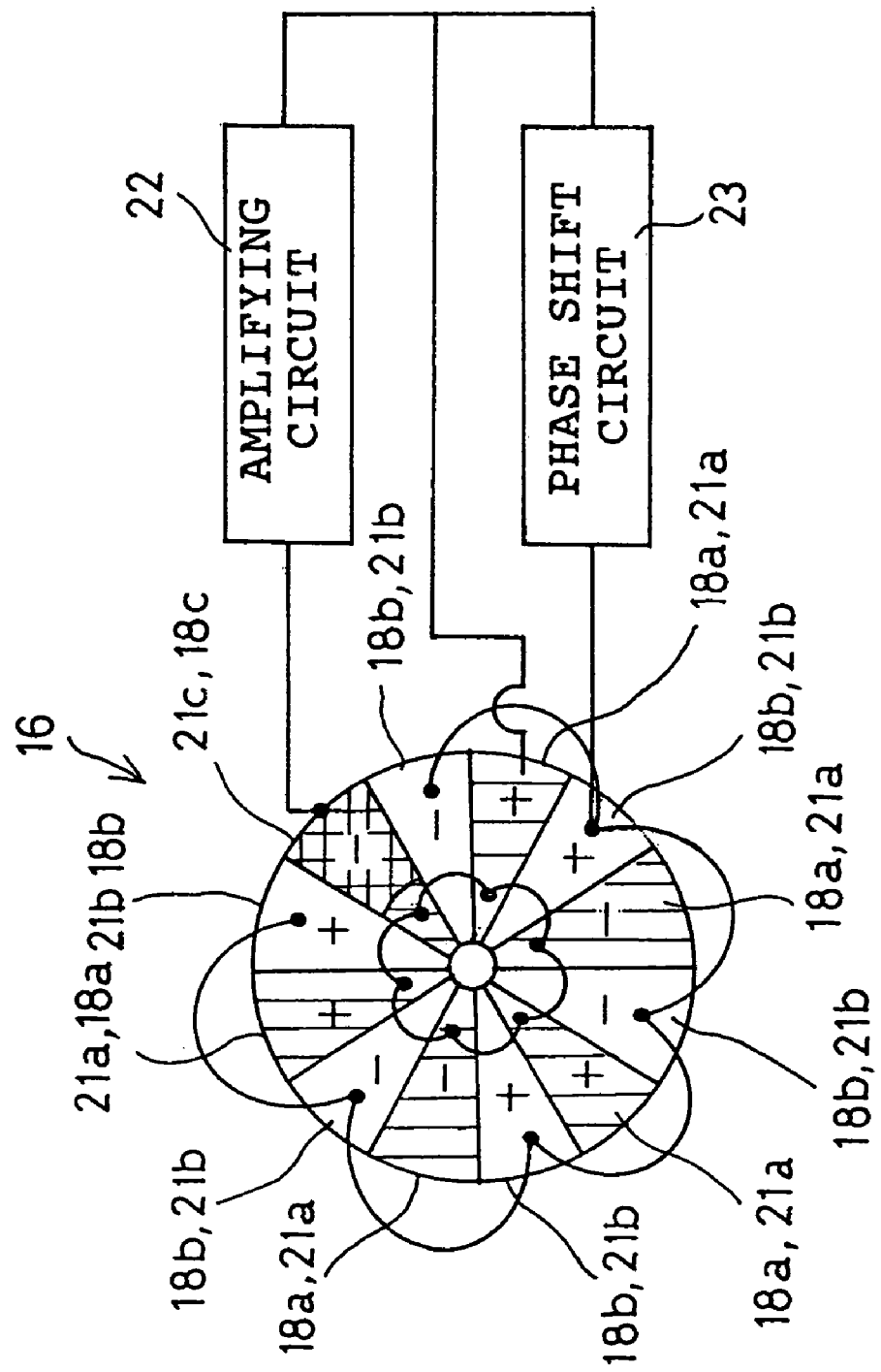
FIG. 10 is a block diagram of a drive circuit of the ultrasonic motor of FIG. 9.

FIG. 9 is a view showing a structure in a perspective direction of an ultrasonic motor according to a second embodiment to which the invention is applied. FIG. 10 shows a block diagram having a piezoelectric vibrating member with a drive circuit according to the present ultrasonic motor.

Embodiment 2 has generally in the same structure as Embodiment 1, wherein the feature lies in that the essential part is constituted by a piezoelectric vibrating member 16 and a rotor 19 placed in abutment against the piezoelectric vibrating member 16. Incidentally, the same structures as those of Embodiment 1 are denoted by the same reference characters, and further explanation is omitted.

The piezoelectric vibrating member 16 is formed by an elastic member 17 and a piezoelectric element 18 bonded to the elastic member 17. The elastic member 17 is circumferentially formed with a plurality of projections 17a on a disc member. Also, the piezoelectric element 18 is provided, similarly to Embodiment 1, with first polarized portions 18a . . . 18a as first driving polarized portions of the invention, second polarized portions 18b . . . 18b as second driving polarized portions of the invention, and a detecting polarized portion 18c, as shown in FIG. 9. Further, there formed are first electrode patterns 21a . . . 21a corresponding to the first polarized portions 18a . . . 18a, second electrode patterns 21b . . . 21b corresponding to the second polarized portions 18b . . . 18b, a detecting electrode 21c corresponding to the detecting polarized portion 18c.

The detecting polarized portion 18c and the detecting electrode 21c are placed symmetric about a loop of a first flexional vibrating wave to be oscillated in the elastic member 17 by the first polarized portion 18a, similarly to the detecting polarized portion 7c and the detecting electrode 12c.

The rotor 19 has an annular friction plate 19a provided on an underside of the disc member to increase a frictional force for the projections 17a.

The drive circuit is formed, as shown in FIG. 10, by an amplifying circuit 22 having an input end connected to the detecting electrode 21c and one of output ends connected to the first electrode pattern 21a, and a phase-shift circuit 23 having one end connected to the other of the amplifying circuit 22 and the other end connected to the second electrode pattern 21b. Here, the phase-shift circuit 23 shifts a phase of a drive signal amplified by the amplifying circuit 22, and inputs it to the second electrode pattern 21b.

Incidentally, although the angle of phase shift may be appropriately selected, it is preferred to set it at 90 degrees in a viewpoint of obtaining a drive force with efficiency.

Now the operation of the ultrasonic motor is explained.

The detecting polarized portion 18c deforms similarly to the first polarized portions 18a . . . 18a. The detecting electrode 21c detects a as drive signal having as main component a drive frequency component f0 created by a piezoelectric effect due to deformation in the detecting polarized portion 18c.

This drive signal is amplified by the amplifying circuit 22 and is outputted to the first electrode pattern 21a and the phase-shift circuit 23. The signal inputted to the phase shift circuit 23 is deviated in phase, for example, by 90 degrees and is inputted to the second electrode pattern 21b.

The first polarized portions 18a . . . 18a and the second polarized portions 18b . . . 18b of the piezoelectric element 18 are oscillated with a phase different by 90 degrees from each other. The elastic member 17 produces a first flextional vibrating wave based on oscillation in the first polarized portions 18a . . . 18a, and a second flextional vibrating wave based on oscillation in the second polarized portions 18b . . . 18b that is different in phase by 90 degrees from the first flectional vibrating wave. These first flectional vibrating wave and second flectional vibrating wave are combined into a circumferential travelling wave. On the other hand, the projections 17a on the elastic member 17 elliptically vibrate to thereby rotate the rotor 19 in a predetermined direction while applying a frictional force onto the friction plate 19a of the rotor 19.

According to the present embodiment, the detecting polarized portion 18c and the detecting electrode 21c detect a drive signal with a drive frequency f0 component as a main component, as described above, providing a similar effect to embodiment 1. Consequently, the detecting polarized portion 18c may be made in a similar shape to that of FIGS. 6A or 6B in accordance with vibration mode due to oscillation.

Embodiment 3

Figure 11:
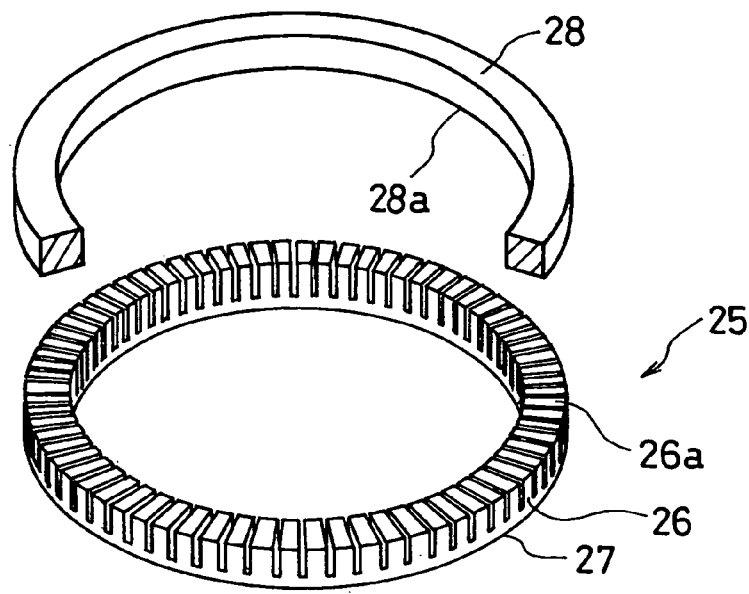
FIG. 11 is a perspective view of an essential part of an ultrasonic motor according to Embodiment 3 of the present invention.
Figure 12:
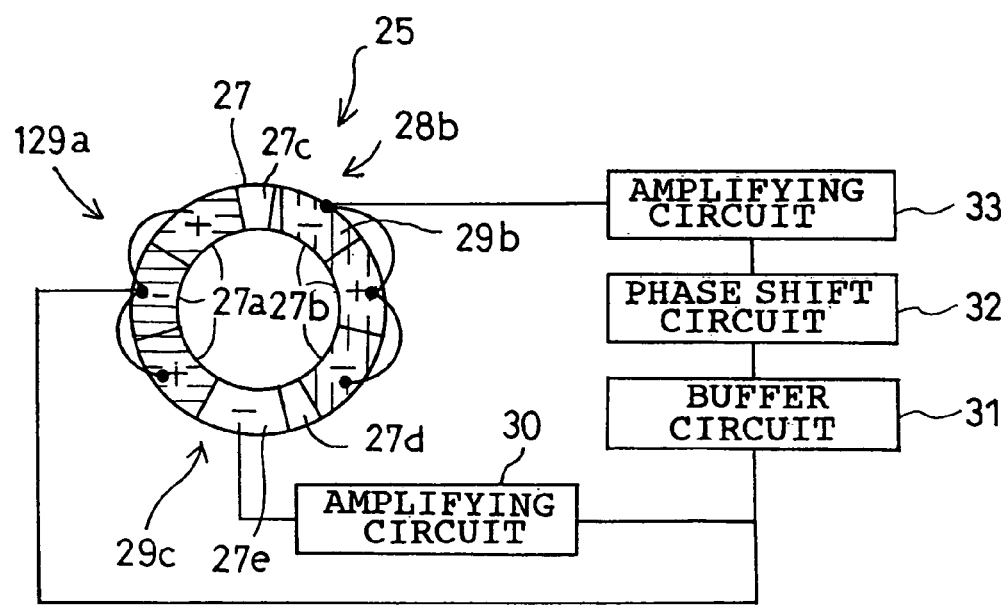
FIG. 12 is a block diagram of a drive circuit of the ultrasonic motor of FIG. 11.
Figure 13:
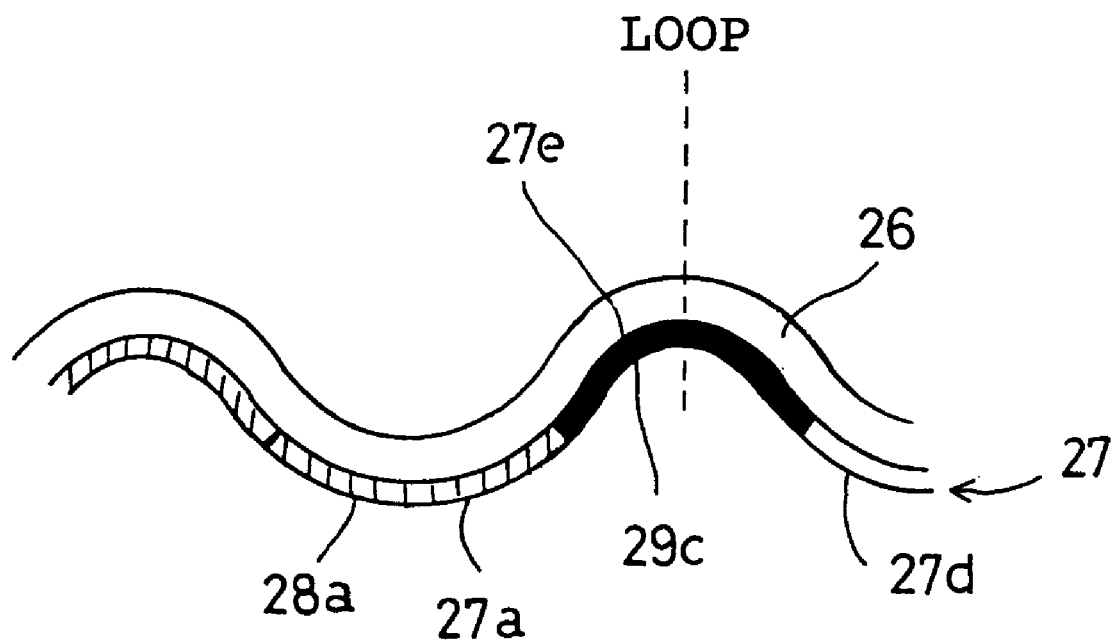
FIG. 13 is a view showing a relationship between a detecting polarized portion and a detecting electrode in vibration of a vibrating member of FIG. 11.

FIG. 11 is a view showing an essential part of an ultrasonic motor according to Embodiment 3 to which the invention is applied. FIG. 12 is a block diagram of a drive circuit of this ultrasonic motor. FIG. 13 is a view showing a positional relationship between a detecting polarized portion 27e and a detecting electrode 29c with respect to a vibration wave on a piezoelectric vibrating member 25.

This ultrasonic motor has generally the same structure as Embodiment 1, and is characterized by its piezoelectric vibrating member 25 and an annular rotor 28 placed in abutment against the piezoelectric vibrating member 25. Incidentally, the same structures are denoted by the same reference characters, and further explanation is omitted.

Here, the piezoelectric vibrating member 25 is formed by an elastic member 26 and a piezoelectric element 27 bonded to the elastic member 26. The elastic member 26 is formed with a plurality of projections 26a on an upper surface of an annular member. Also, the piezoelectric element 27 is in an annular shape corresponding to the elastic member 26, and has in a circumferential direction a first polarized portion 27a formed as a first driving polarized portion of the invention, a second polarized portion 27b formed as a second driving polarized portion of the invention, gaps 27c, 27d, and a detecting polarized portion 27e, as shown in FIG. 12.

The first polarized portion 27a corresponds to a 3/2 wavelengths of a first flexion vibrating wave, hereinafter referred to, caused in the elastic member 26, which includes continuous three divisional portions each corresponding to a 1/2 wavelength. The divisional portions are polarized in alternate directions with respect to a thickness direction. A first drive electrode pattern 29a is formed, at a position corresponding to the first polarized portion 27a, on an opposite surface to the surface bonded with the elastic member 26.

The second polarized portion 27b, on the other hand, is formed by three divisional portions each corresponding to a 1/2 wavelength of a second flexion vibrating wave, hereinafter referred to. The divisional portions are polarized in alternate directions with respect to a thickness direction. Further a second drive electrode pattern 29b is formed. By oscillation in this second polarized portion 27b, a second flexion vibrating wave is caused in the elastic member 26 which is same in wavelength as the first flexion vibrating wave but different in phase by 90 degrees therefrom.

Meanwhile, the gap 27c corresponds to a 1/4 wavelength of the flexion vibrating wave while the gap 27d to a 3/4 wavelength of the flexion vibrating wave.

The detecting polarized portion 27e in the gap 27d is provided continuous with the first polarized portion 27a to have a 1/2 wavelength of the flexion vibrating wave, and reversely (−) polarized correspondingly to the first polarized portion 27a. Further, a detecting electrode 29c is formed on the surface.

These detecting polarized portion 27e and the detecting electrode 29c are arranged in a positional relationship, as shown in FIG. 13, where a first flexion vibrating wave is caused in the elastic member 26 by the first polarized portion 27a, they have a 1/4 wavelength and symmetrical about a loop of the flexion vibrating wave.

In this manner, the separate provision of the detecting polarized portion 27e and detecting electrode 29c from the first polarized portion 27a makes possible to secure an increased detecting area in the detecting polarized portion 27e without decreasing an oscillation area in the first polarized portion 27a and second polarized portion 27b.

The drive circuit is formed by an amplifying circuit 30 having an input end connected to the detecting electrode 29c and one of output ends connected to the first drive electrode pattern 29a, and a buffer circuit 31 having one end connected to the other end of the amplifier circuit 30, a phase-shift circuit 32 having one end connected to the other of the buffer circuit 31, and a second amplifying circuit 33 having one end connected to the other end of the phase-shift circuit 32 and the other end connected to the second drive electrode pattern 29b, thereby constituting a self-oscillating circuit.

Here, the buffer circuit 31 is set high in input impedance and low in output impedance. This decreases an input of a signal amplified by the amplifying circuit 30 to the phase shift circuit 32, and secures a signal amount in the self-oscillation loop formed by the amplifying circuit 30 and the first driving electrode pattern 29a.

Also, the second amplifying circuit 33 reamplifies a signal deviated in phase due to the phase shift circuit 32 to nearly equalize between the amount of a signal inputted to the first driving electrode pattern 29a and the amount of a signal inputted to the second driving electrode pattern 29b.

Now the operation of the ultrasonic motor is explained.

The detecting polarized portion 27e similarly deforms to the divisional portion of the first polarized portion 27a. The detecting electrode 29c detects a drive signal having as a main component a drive frequency f0 component caused by a piezoelectric effect due to the deformation of the detecting polarized portion 27e.

This drive signal is amplified by the amplifying circuit 30 and inputted to the first driving electrode pattern 29a and the buffer circuit 31.

At this time, the buffer circuit 31 decreases an input of the amplified drive signal to the phase shift circuit 32, and on the other hand secures the amount of a signal inputted to the first driving electrode pattern 29a. Due to this, the phase shift circuit 32 is reduced in load, and the self-oscillation loop with the first polarized portion 27a and the amplifying circuit 30 is stabilized.

The drive signal outputted from the buffer circuit 31 is deviated in phase, for example, by 90 degrees by the phase sift circuit 32 and again amplified by the second amplifier 33, thus being inputted to the second driving electrode pattern 29b.

At this time, the amount of the signal inputted to the second driving electrode pattern 29b becomes nearly equal to the amount of the signal inputted to the first driving electrode pattern 29a.

The first polarized portion 27a and the second polarized portion 27b of the piezoelectric element 27 are oscillated in phase different by 90 degrees from each other. The elastic member 26 causes a first flexion vibrating wave based on the oscillation in the first polarized portion 27a, and also a second flexion vibrating wave different in phase by 90 degrees from the first flexion vibrating wave based on the oscillation of the second polarized portion 27b. The first flexion vibrating wave and second flexion vibrating wave are combined into a circumferential traveling wave. On the other hand, the projections 26a on the elastic member 26 elliptically vibrate to apply a frictional force with magnification to the friction plate 28a of the rotor 28, thereby rotating the rotor 28 in a predetermined direction.

At this time, the first flexion vibrating wave and the second flexion vibrating wave are almost the same in magnitude to adjust the elliptic vibration in the projections 26a of the elastic member 26.

From the above, the present embodiment provides the similar effect to Embodiment 1. Besides, the separate provision of the detecting polarized portion 27e from the first polarized portion 27a makes possible to secure a large detecting area in the detecting electrode 29c, detecting a great-magnitude signal. Also, the drive force is maintained because there is no decrease of the oscillation areas in the first polarized portion 27a and the second polarized portion 27b.

Also, the buffer circuit 31 decreases the input signal amount to the phase shift circuit 32, while securing the input amount of the amplified signal to the first driving electrode pattern 29a. This stabilizes the self-oscillation in the loop formed by the first polarized portion 27a and the amplifying circuit 30.

Because the first driving electrode pattern 29a and the second driving electrode pattern 29b are made almost equal in input signal amount by the second amplifier 33, the first flexion vibrating wave and the second flexion vibrating wave becomes equal in amplitude to thereby adjusting the elliptic vibration.

Incidentally, the ultrasonic motor of Embodiment 3 may be modified as follows.

Figure 14:
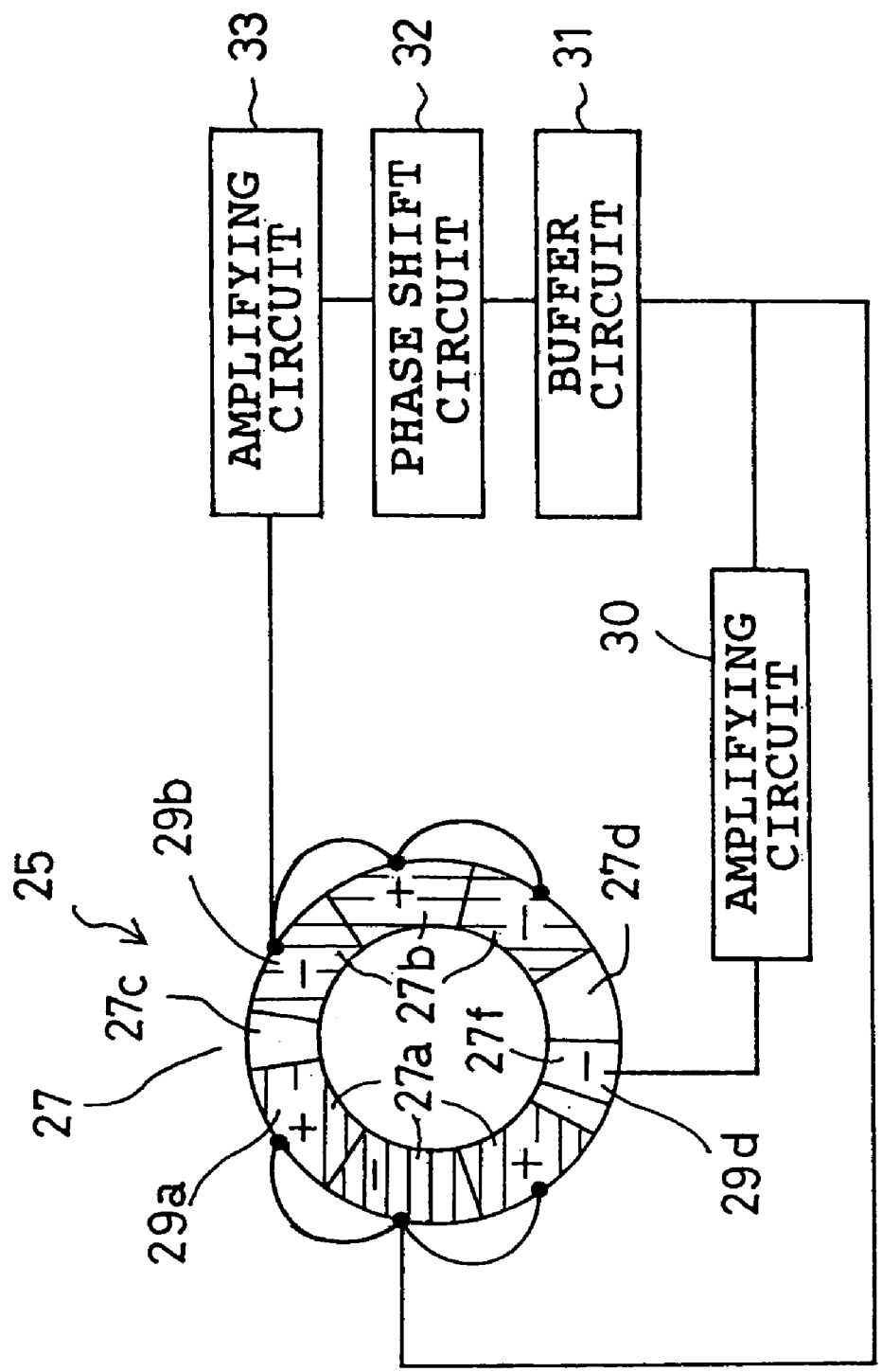
FIG. 14 is a block diagram of a drive circuit according to a first modification to FIG. 11.
Figure 15:
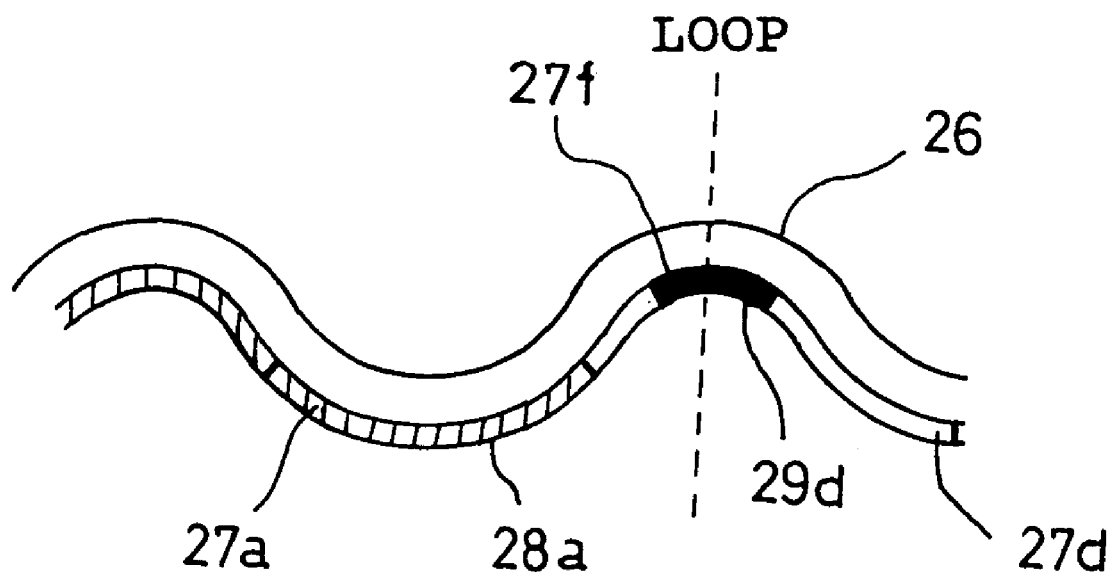
FIG. 15 is a view showing a relationship between a detecting polarized portion and a detecting electrode in vibration of a piezoelectric vibrating member of FIG. 14.

FIG. 14 shows a block diagram of a drive circuit according to a first modification, while FIG. 15 shows a positional relationship of the detecting polarized portion 27f and detecting electrode 29d with respect to the piezoelectric vibration member 25.

The first modification is characterized by the positional relationship concerning the detecting polarized portion 27f and the detecting electrode 29d that are provided in the gap 27d on the piezoelectric element 27.

As shown in FIG. 14, the detecting polarized portion 27f is provided symmetrical about a loop of a flexion vibrating wave caused by the first polarized portion 27a to have a 1/8 wavelength on each side in the gap 27d. Also, polarization is provided reverse (−) correspondingly to the first polarized portion 27a, and further the detecting electrode 29d is formed corresponding to the detecting polarized portion 27f.

In this manner, the size of the detecting polarized portion 27f and detecting electrode 29d is appropriately selectable.

Figure 16:
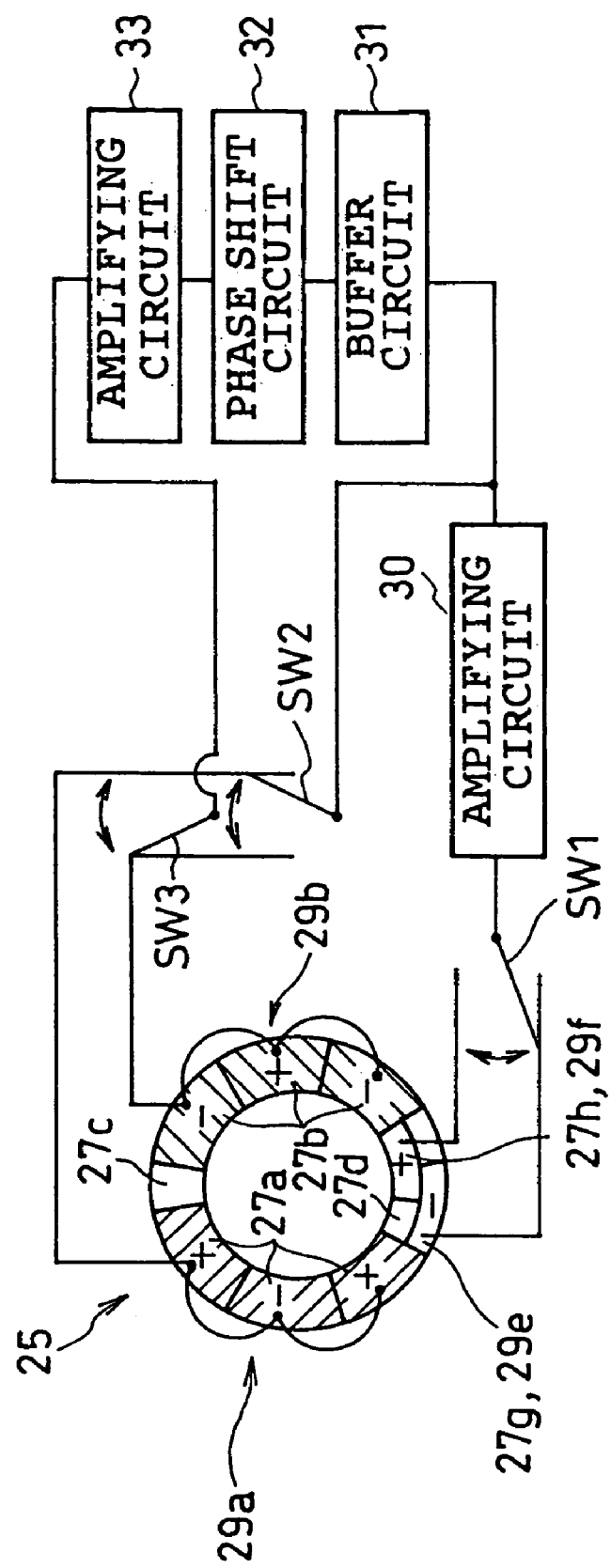
FIG. 16 is a block diagram of a drive circuit according to a second modification to FIG. 11.

FIG. 16 shows a block diagram of a drive circuit according to a second modification.

The second modification has a first detecting polarized portion 27g, first detecting electrode 29e, second detecting polarized portion 27h, and second detecting electrode 29f in addition to the first modification, thereby making the rotor 28 rotatable in opposite directions.

That is, the first detecting polarized portion 27g is provided in a radially-outward half area in a manner continuous with the first polarized portion 27a in the gap 27d on the piezoelectric element 27, to have circumferentially a 1/2 wavelength of the first flexion vibrating wave, wherein that portion is polarized reverse (−). Also, the first detecting electrode 29e is formed corresponding to the first detecting polarized portion 27g. That is, the first detecting polarized portion 27g and first detecting electrode 29e is provided symmetrical about a first vibrating wave loop to have a 1/4 wavelength on each side whereby it deforms similarly to the divisional portions of the first polarized portion 27a.

Also, the second detecting polarized portion 27h is provided in a radially-inward half area in a manner continuous with the second polarized portion 27b in the gap 27d on the piezoelectric element 27, to have circumferentially a 1/2 wavelength of the second flexion vibrating wave, wherein that portion is polarized positive (+). Also, the second detecting electrode 29f is formed corresponding to the second detecting polarized portion 27h. That is, the second detecting polarized portion 27h and second detecting electrode 29t is provided symmetrical about a second vibrating wave loop to have a 1/4 wavelength on each side whereby it deforms similarly to the divisional portions of the second polarized portion 27b.

Meanwhile, the drive circuit is provided with the first detecting electrode 29e, a SW1 for switching connection between the second detecting electrode 29f and an input end of an amplifying circuit 30, a first drive electrode pattern 29a, a SW2 for switching connection between the second drive electrode pattern 29b and an output end of the amplifying circuit 30, the first drive electrode pattern 29a, a SW3 for switching connection between the second drive electrode pattern 29b and an output end of a second amplifying circuit 33.

Now explanation is made on the operation of the ultrasonic motor according to the second modification.

First, SW1 is connected between the first detecting electrode 29e and the input end of the amplifying circuit 30, SW2 is connected between the output end of the amplifying circuit 30 and the first driving electrode pattern 29a, and SW3 is connected between the output end of the second amplifying circuit 33 and the second driving electrode pattern 29b.

At this time, the first polarized portion 27a and the second polarized portion 27b of the piezoelectric element 27 are oscillated different in phase by 90 degrees from each other. A first flexion vibrating wave is caused in the elastic member 26 based on the oscillation of the first polarized portion 27a. Also, a second flexion vibrating wave is caused therein with a delay in phase of 90 degrees with respect to the first flexion vibrating wave based on the oscillation of the second polarized portion 27b.

The first flexion vibrating wave and second flexion vibrating wave are combined into a clockwise traveling wave. The projections 26a on the elastic member 26 are elliptically vibrated counterclockwise to apply a frictional force onto the friction plate 28a of the rotor 28, rotating the rotor 28 in the clockwise direction.

Then, SW1 is connected between the second detecting electrode 29f and the input end of the amplifying circuit 30, SW2 is connected between the output end of the amplifying circuit 30 and the second driving electrode pattern 29b, and SW3 is connected between the output end of the amplifying circuit 33 and the first driving electrode pattern 29a.

The second detecting electrode 29f detects a drive signal caused by deformation of the second detecting polarized portion 27h. This drive signal is amplified by the amplifying circuit 30 and inputted to the second driving electrode pattern 29b and the buffer circuit 31.

The drive signal outputted from the buffer circuit 31 is deviated in phase by 90 degrees by the phase shift circuit 32, and amplified by the second amplifying circuit 33, inputted to the first driving electrode pattern 29a.

At this time, the first-polarized portion 27a and the second polarized portion 27b of the piezoelectric element 27 are oscillated different in phase by 90 degrees from each other. A first flexion vibrating wave is caused in the elastic member 26 based on the first polarized portion 27a, while a second flexion vibrating wave is caused therein with advance in phase by 90 degrees with respect to the first flexion vibrating wave based on the oscillation of the second polarized portion 27b.

The first flexion vibrating wave and the second flexion vibrating wave are combined into a clockwise traveling wave. On the other hand, the projections 26a on the elastic member 26 elliptically vibrate in the clockwise direction to apply a frictional force onto the friction plate 28a of the rotor 28, rotating the rotor 28 in the counterclockwise direction.

By switching SW1, SW2 and SW3 as above, the rotor 28 is rotated clockwise due to the drive signal detected by the first detecting polarized portion 27g and the first detecting electrode 29e. Also, the rotor 28 is rotated counterclockwise due to the drive signal detected by the second detecting polarized portion 27h and the second detecting electrode 29f.

Embodiment 4

Figure 17:
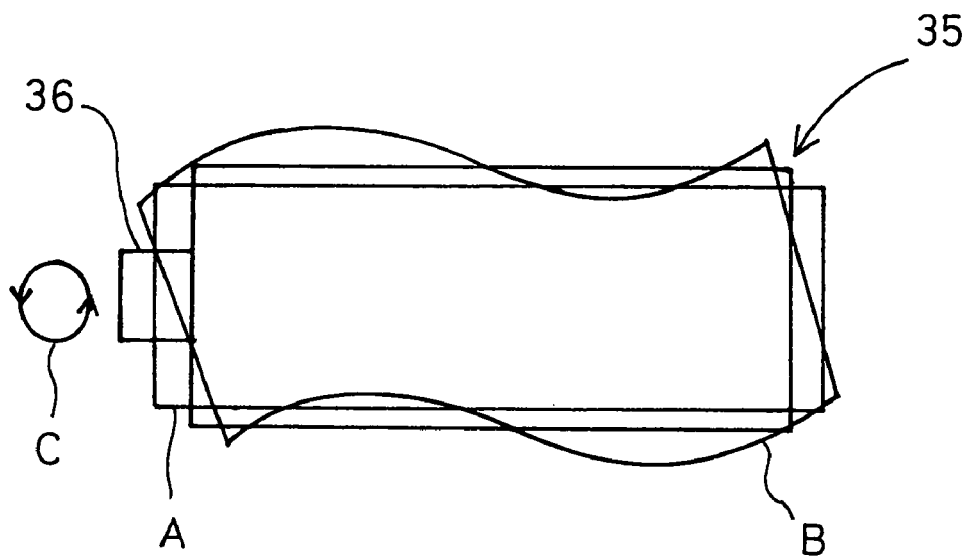
FIG. 17 is a plan structure of an ultrasonic motor according to Embodiment 4 of the present invention.
Figure 18:
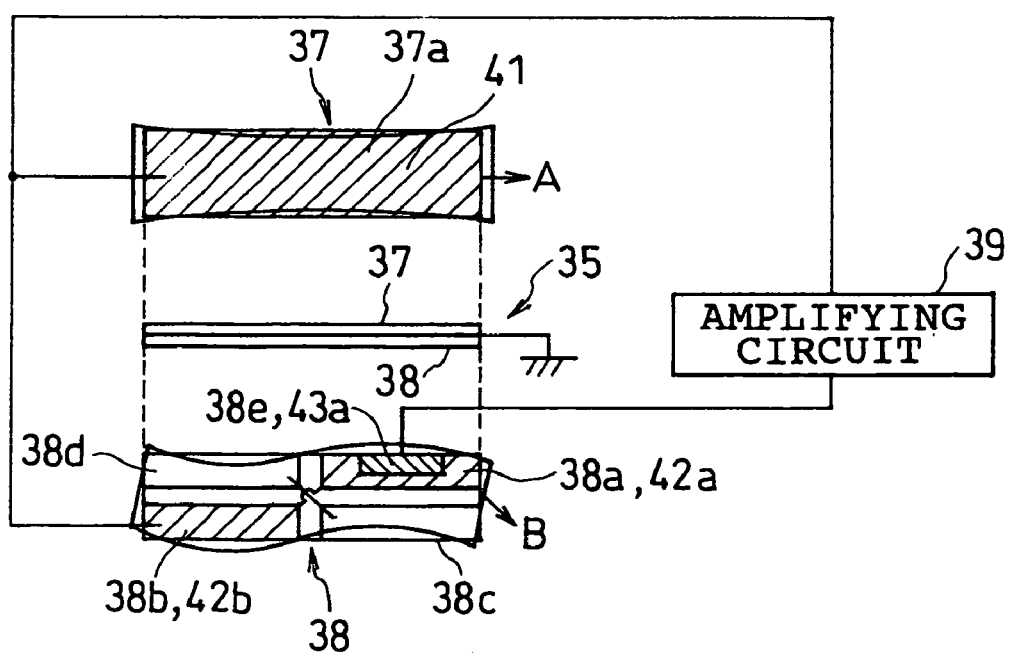
FIG. 18 is a view showing an overlying piezoelectric vibrating members with a drive circuit of FIG. 17.

FIG. 17 shows a plan structure of an ultrasonic motor according to Embodiment 4 to which the invention is applied, while FIG. 18 shows a structure of an overlaid piezoelectric vibrating member with a drive circuit.

This ultrasonic motor is formed by a piezoelectric vibrating member 35 and an output extracting member 36 for vibration magnification provided at an edge of the piezoelectric vibrating member 35. The output extracting member 36 has its tip abutted against a not-shown moving member.

Here, the piezoelectric vibrating member 35 is formed, as shown in FIG. 18, by a first piezoelectric vibrating member 37 and a second piezoelectric vibrating member 38 laid in the thickness direction over the first piezoelectric vibrating member 37.

The first piezoelectric vibrating member 37 is a rectangular plate formed using a piezoelectric material, an entire surface of which is applied by an electric field with overlaying surface in thickness direction given negative and an opposite surface to the overlying surface given positive, thereby providing a polarized portion 37a as a first driving polarized portion of the invention. A drive electrode 41 is formed on the opposite surface to the overlying surface in the thickness direction of the polarized portion 37a, while a not-shown electrode is formed on the other surface. The polarized portion 37a is oscillated to cause a stretching vibrating wave A as shown by a solid line in the figure.

The second piezoelectric vibrating member 38 is rectangular in shape similarly to the first piezoelectric vibrating member 37, and having first and second polarized portion 38a, 38b at diagonal positions and third and fourth polarized portion 38c, 38d at different diagonal positions wherein these polarized portions are as a second driving polarized portion of the invention and obtained by dividing into two longer and shorter sides. Here, the first polarized portion 38a, the second polarized portion 38b, the third polarized portion 38c and the fourth polarized portion 38d are polarized by applying an electric field with the overlaying surface given negative and the opposite surface to the overlaying surface given positive.

Meanwhile, a detecting polarized portion 38e is provided symmetrical about a loop of a flexion vibrating wave B, to be referred later, by utilizing a part of the first polarized portion 38a. The detecting polarized portion 38e detects a drive signal with a drive frequency f0 as a main component, which can reduce the number of parts due to partly utilization of the first polarized portion 38a.

Also, a first drive electrode 42a is formed on the opposite surface to the overlaying surface correspondingly to the first polarized portion 38a, while a second drive electrode 42b is formed correspondingly to the second polarized portion 38b. The first drive electrode 42a and the second drive electrode 42b are connected through a lead. Also, a detecting electrode 43a is formed correspondingly to the detecting polarized portion 38e.

If the first polarized portion 38a and the second polarized portion 38b are oscillated, when the first polarized portion 38a and the second polarized portion 38b expand lengthwise, the third polarized portion 38c and the fourth polarized portion 38d are contacted relative thereto. On the other hand, when the first polarized portion 38a and the second polarized portion 38b contract lengthwise, the third polarized portion 38c and the fourth polarized portion 38d expand relative thereto. Thus, a flexion vibrating wave B is caused as an entirety.

The drive circuit is formed, as shown in FIG. 18, with a self-oscillation circuit by connecting the detecting electrode 43a to an input end of an amplifying circuit 39 and the output end of the amplifying circuit 39 to the drive electrode 41 and the second drive electrode 42b.

Now explanation is made on the operation of this ultrasonic motor based on FIG. 18.

The detecting polarized portion 38e deforms similarly to the first polarized portion 38a. The detecting electrode 43a detects a drive signal with a drive frequency f0 as a main component caused by a piezoelectric effect due to deformation of the detecting polarized portion 38e.

This drive signal is amplified by the amplifying circuit 39 and is inputted to the drive electrode 41 of the first piezoelectric member 37 where it is fed back to the second driving electrode 42b of the second piezoelectric member 38.

At this time, the polarized portion 37a of the first piezoelectric vibrating member 37 is oscillated whereby the first piezoelectric vibrating member 37 causes a stretching vibrating wave A. On the other hand, the first polarized portion 38a and the second polarized portion 38b of the second piezoelectric vibrating member 38 are oscillated whereby the second piezoelectric vibrating member 38 causes as an entirety a flexion vibrating wave B. As a result, the output extracting member 36 performs elliptic oscillation C shown by solid lines in FIG. 17 which is a combination of the stretching vibrating wave A and the flexion vibrating wave B, and periodically abuts against a not-shown moving member to apply a frictional force thereto in one direction thus moving the moving member.

According to the present embodiment, the detecting polarized portion 38e and the detecting electrode 43a are provided symmetrical about a loop of a flexion vibrating wave B on the second piezoelectric vibrating member 38 in order to increase the magnitude of the detection signal in a desired vibration mode, thereby detecting a drive signal with a drive frequency component f0 as a main component. Thus, spurious vibration is suppressed and self-oscillation is stabilized. Also, because the detecting polarized portion 38e and the detecting electrode 43a are provided utilizing a part of the first polarized portion 38a, the apparatus is structurally reduced in size.

Incidentally, the ultrasonic motor according to Embodiment 4 may be modified as described below.

Figure 19:
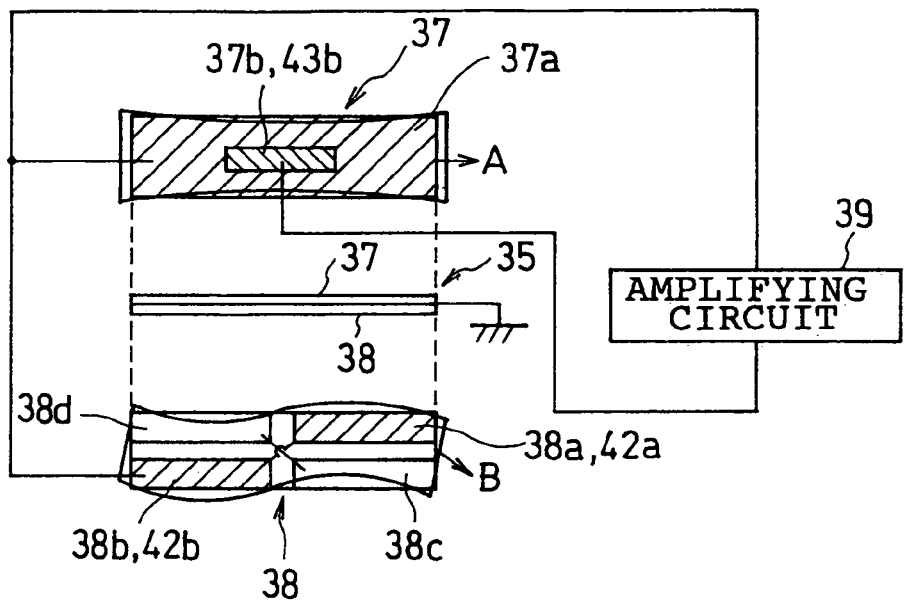
FIG. 19 is a view showing piezoelectric vibrating members with a drive circuit of a first modification to FIG. 17.

FIG. 19 is a view showing a first modification to Embodiment 4.

In the first modification, a detecting polarized portion 37b is provided at a center of a polarized portion 37a of the first piezoelectric vibrating member 37, which is lengthwisely symmetrical about a node of a stretching vibrating wave A. A detecting electrode 43b is formed correspondingly to the detecting polarized portion 37b.

By arranging the detecting polarized portion 37c and the detecting electrode 43c at a position greatest in deformation in this manner, the detecting polarized portion 37c is symmetrically deformed to detect a drive signal that has a drive frequency f0 component increased relative to unwanted frequency components.

Figure 20:
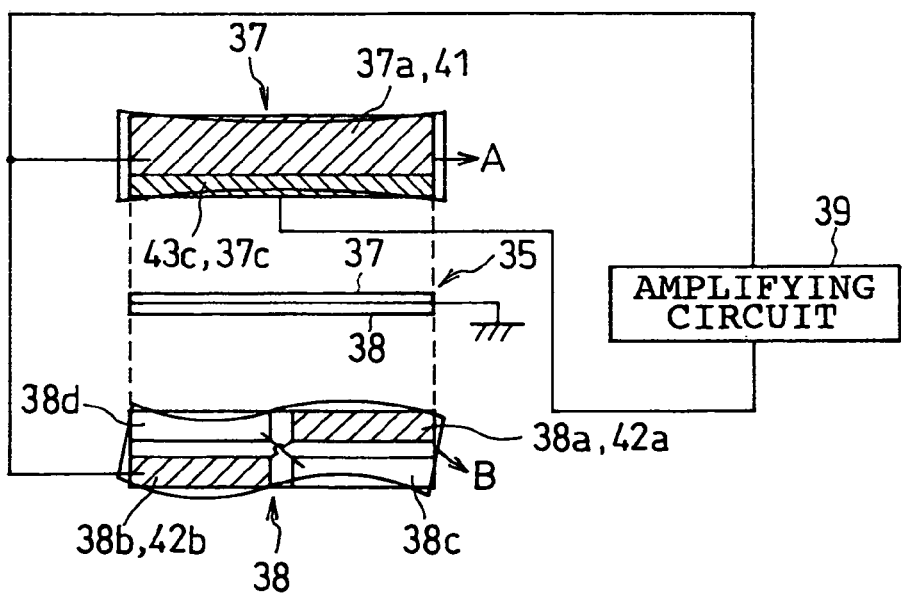
FIG. 20 is a view showing piezoelectric vibrating members with a drive circuit of a second modification to FIG. 17.

FIG. 20 is a view showing a second modification to Embodiment 4.

In the second modification, a detecting polarized portion 37c and the detecting electrode 43c are provided lengthwisely symmetrical about a node of a stretching vibrating wave A at a longer edge of the polarized portion 37a in the first piezoelectric vibrating member 37.

Figure 21:
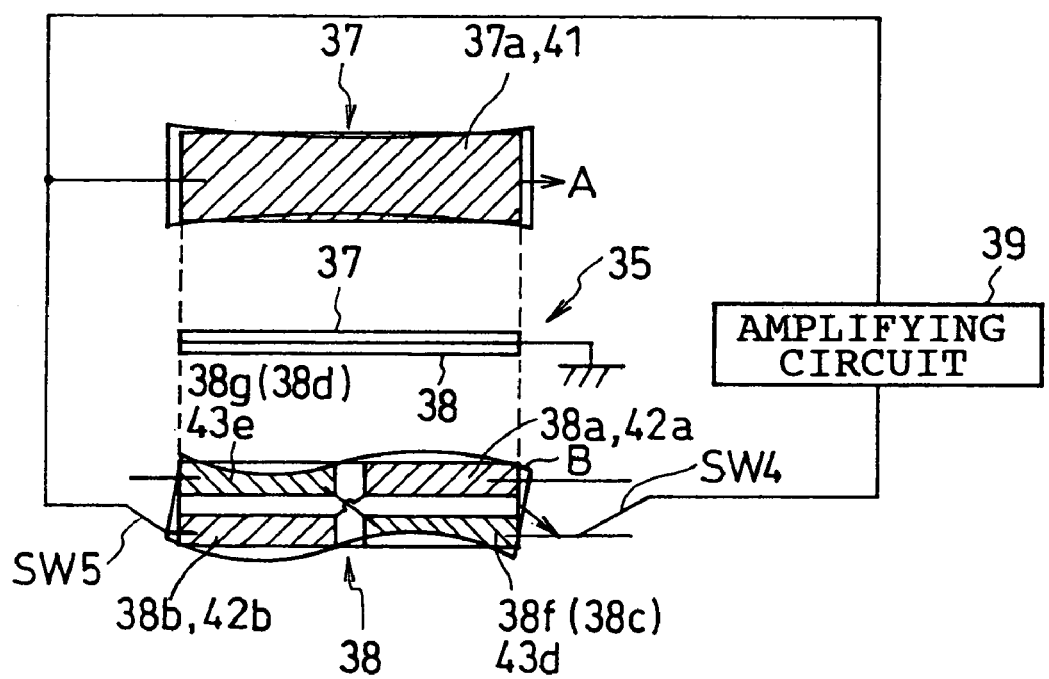
FIG. 21 is a view showing piezoelectric vibrating members with a drive circuit of a third modification to FIG. 17.

FIG. 21 is a view showing a third modification to Embodiment 4.

In the third embodiment, a first detecting polarized portion 38f is provided utilizing the entire of a third polarized portion 38c. A first detecting electrode 43d is formed correspondingly to the first detecting polarized portion 38f. A second detecting polarized portion 38g is provided utilizing the entire of a fourth polarized portion 38d. A second detecting electrode 43e is formed correspondingly to the second detecting polarized portion 38g. Also, the first detecting electrode 43d and the second detecting electrode 43e are connected through a lead.

That is, the first detecting polarized portion 38f, the first detecting electrode 43d, the second detecting polarized portion 38g and the second detecting electrode 43e are provided symmetric about a loop of a flexion vibrating wave B.

Because the polarized portions 38c, 38d in non-use are utilized for the first detecting polarized portion 38f and the second detecting polarized portion 38g in this manner, it is possible to secure a detection area with sufficiency without decreasing an oscillation area in the first polarized portion 38a and the second polarized portion 38b.

Meanwhile, if SW4 is switched to the first detecting electrode 43d, SW5 is connected between the amplifying circuit 39 and the second drive electrode 42b. Also, if SW4 is switched to the first drive electrode 42a, SW5 is connected between the amplifying circuit 39 and the second detecting electrode 43e.

If SW4 is switched to the first detecting electrode 43d and SW5 to the second drive electrode 42b, a stretching vibrating wave A and flexion vibrating wave B are caused in the piezoelectric vibrating member 35 so that the output extracting member 36 has elliptic vibration C to move the moving member in a positive direction.

On the other hand, if SW4 is switched to the first drive electrode 42a and SW5 to the second detecting electrode 43e, the first polarized portion 38a and first drive electrode 42a detect a drive signal. This drive signal is amplified by the ampifying circuit 39 and is inputted to the drive electrode 41 of the first piezoelectric vibrating member 37, and is also fed back to the second detecting electrode 43e. Thereupon, the second piezoelectric vibrating member 38 produces a flexion vibrating wave different in phase by 180 degrees from the flexion vibrating wave B. Thus, the output extracting member 36 elliptically vibrates in a direction opposite to the elliptic vibration C, moving the moving member in a reverse direction.

Figure 22:
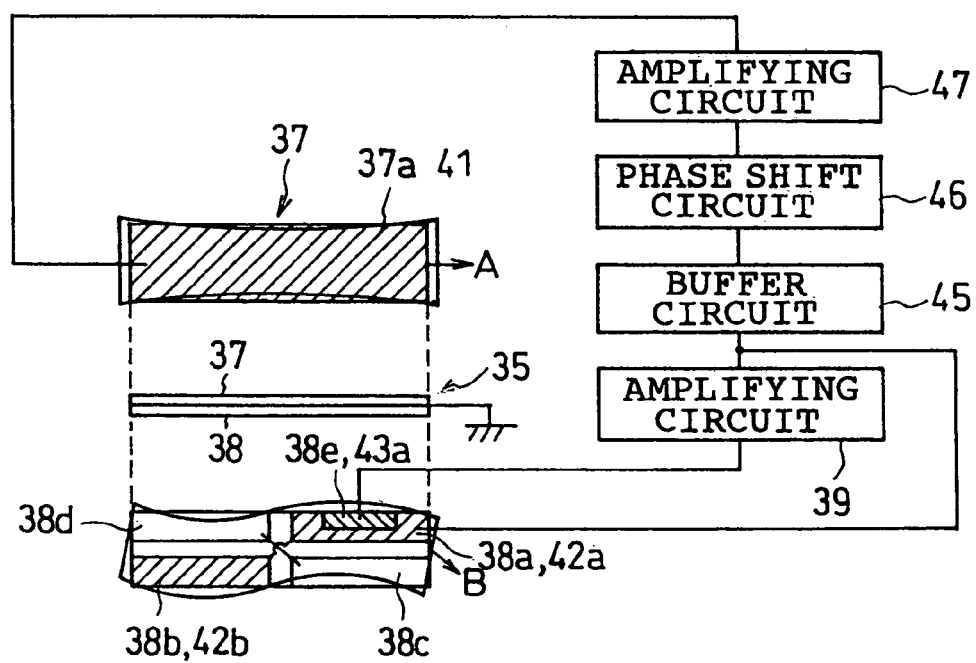
FIG. 22 is a view showing piezoelectric vibrating members with a drive circuit of a fourth modification to FIG. 17.

FIG. 22 is a view showing a fourth modification to Embodiment 4.

In the fourth modification, a buffer circuit 45, a phase shift circuit 46 and a second amplifying circuit 47 are provided, in addition to Embodiment 4, between the amplifying circuit 39 and the drive electrode 37a of the first piezoelectric vibrating member 37.

The drive signal detected through the detecting electrode 43a is amplified by the amplifying circuit 39 and is then inputted to the first drive electrode 42a of the second piezoelectric vibrating member 38. On the other hand, the drive signal is deviated in phase by the phase shifting circuit 46 and again amplified by the second amplifying circuit 47, being inputted to the drive electrode 41 of the piezoelectric vibrating member 37.

At this time, the polarized portion 37a of the first piezoelectric vibrating member 37 is oscillated with shift in phase with respect to those of the first polarized portion 38a and the second polarized portion 38b of the second piezoelectric vibrating member 38. The output extracting member 36 is elliptically vibrated in a different path from the elliptic vibration C, due to the stretching vibrating wave and flexion vibrating wave B deviated in phase from the expansion vibrating wave A. Due to this, the frictional force applied to the moving member is varied, thus adjusting the drive force.

Figure 23:
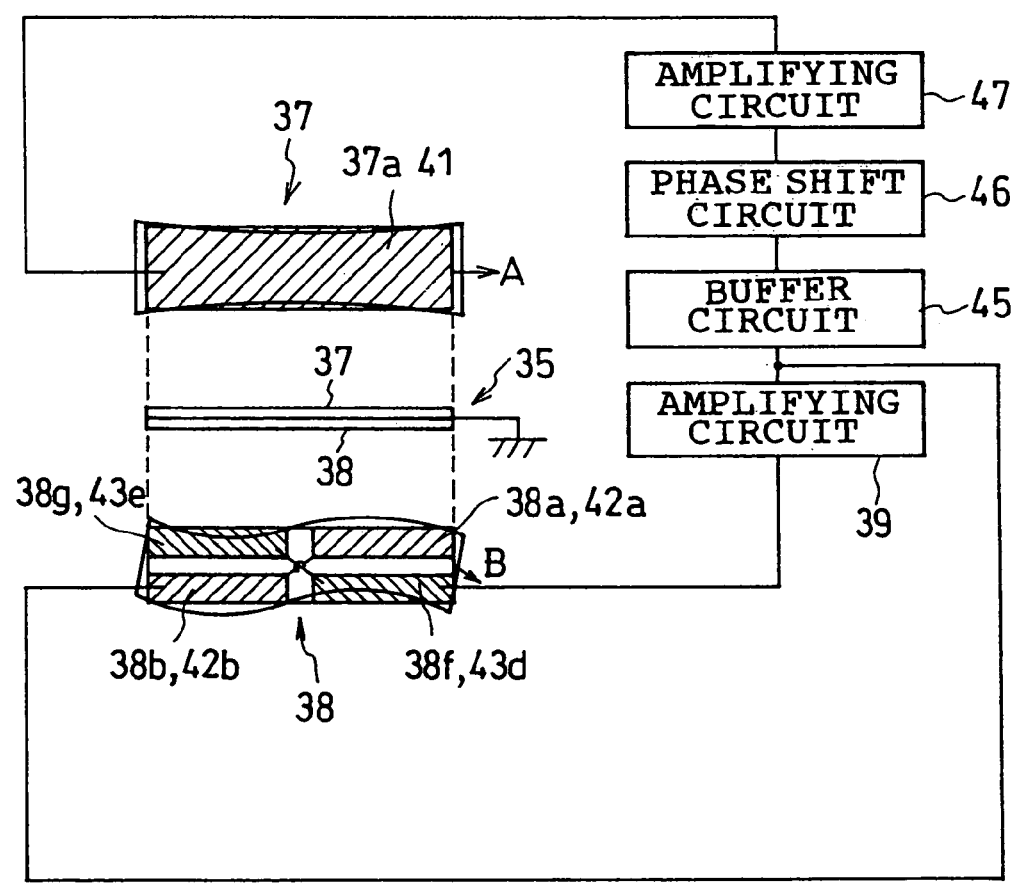
FIG. 23 is a view showing piezoelectric vibrating members with a drive circuit of a fifth modification to FIG. 17.

FIG. 23 is a view showing a fifth modification to Embodiment 4.

In the fifth modification, a buffer circuit 45, a phase shift circuit 46 and a second amplifying circuit 47 are provided, in addition to the third modification, between the amplifying circuit 39 and the drive electrode 37a of the first piezoelectric vibrating member 37.

The drive signal detected through the first detecting electrode 43d and second detecting electrode 43e is amplified by the amplifying circuit 39. One part of the amplified drive signal is fed back to the second drive electrode 42b, while the other of the drive signal is shifted in phase by the phase shift circuit 46 and again amplified by the amplifying circuit 47, being inputted to the drive electrode 41 of the first piezoelectric vibrating member 37.

This structure can adjust the drive force, similarly to the fourth modification.

Figure 24:
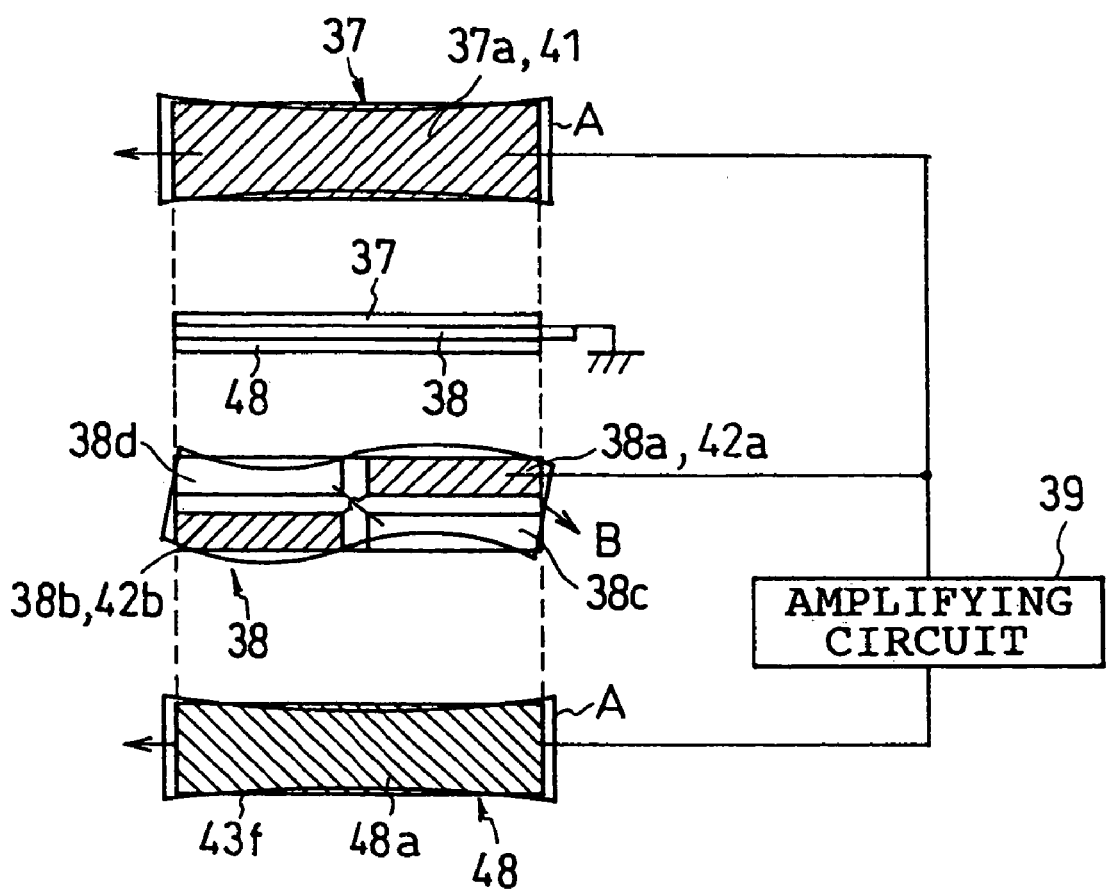
FIG. 24 is a view showing piezoelectric vibrating members with a drive circuit of a sixth modification to FIG. 17.

FIG. 24 is a view showing a sixth modification to Embodiment 4.

The sixth modification has further a signal-detecting third piezoelectric vibrating member 48 overlying the first piezoelectric vibrating member 37 and the second piezoelectric vibrating member 38.

This third piezoelectric vibrating member 48 has a detecting polarized portion 48a processed by polarization similarly to the first piezoelectric vibrating member 37. A detecting electrode 43f is formed correspondingly to this detecting polarized portion 48a. That is, the detecting polarized portion 48a and detecting electrode 43f are provided symmetrical about a node of a stretching vibrating wave A.

Meanwhile, the detecting electrode 43f is connected to an input end of the amplifying circuit 39 while an output end of the amplifying circuit 39 is connected to the drive electrode 41 of the first piezoelectric vibrating member 37 as well as to the first drive electrode 42a of the second piezoelectric vibrating member 38. Thus a self-oscillation circuit is formed.

By the separate provision of the detecting polarized portion 48a from the first piezoelectric vibrating member 37 in this manner, a detection area can be secured without decreasing the oscillation area. With the same shape as the drive electrode, it is possible to efficiently detect a signal having a frequency component of an oscillation mode given by oscillation through the drive electrode.

The detecting polarized portion 48a deforms similarly to the polarized portion 37a of the first piezoelectric vibrating member 37. The detecting electrode 43f detects a signal having a drive frequency f0 as a main component caused by a piezoelectric effect due to the deformation in the detecting polarized portion 48a. This drive signal is amplified by the amplifying circuit 39 and is inputted to the drive electrode 41 of the first piezoelectric vibrating member 37 and the first drive electrode 42a of the second piezoelectric vibrating member 38.

Figure 25:
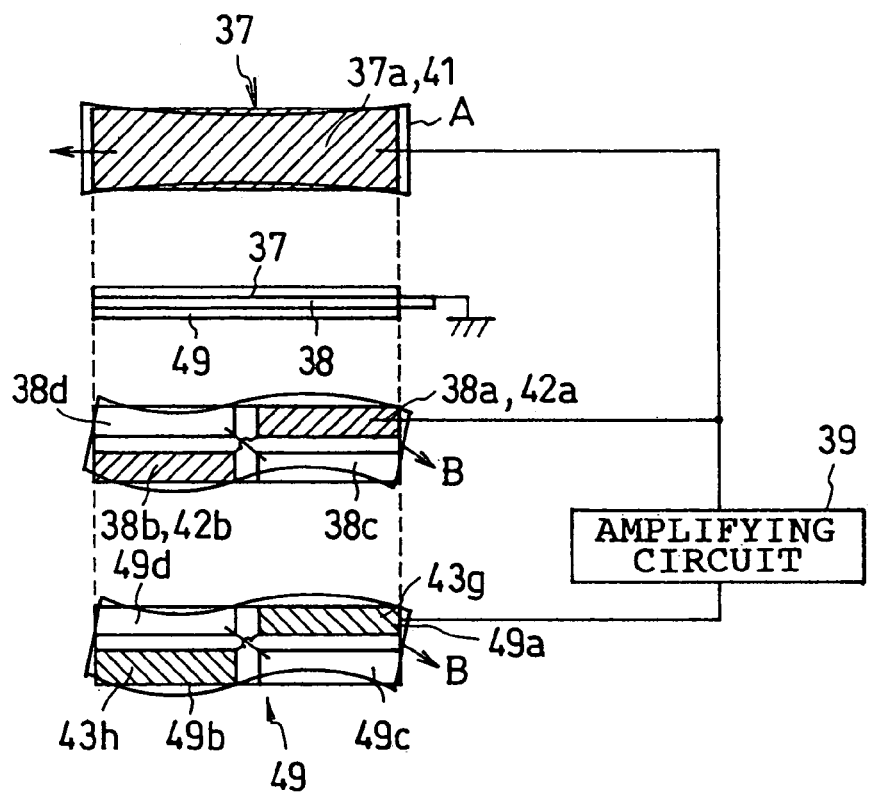
FIG. 25 is a view showing piezoelectric vibrating members with a drive circuit of a seventh modification to FIG. 17.

FIG. 25 is a view showing a seventh modification to Embodiment 4.

In the seventh modification, a signal-detecting third piezoelectric vibrating member 49 is formed overlying the second piezoelectric member 38.

On the third piezoelectric vibrating member 49, a first detecting polarized portion 49a and a second detecting polarized portion 49b are provided through polarization similarly to the second piezoelectric vibrating member 38. A first detecting electrode 43g and a second detecting electrode 43h are formed correspondingly to those portions. The first detecting electrode 43g and the second detecting electrode 43h are connected through a lead.

Meanwhile, the first detecting electrode 43g and the second detecting electrode 43h are connected to an input end of an amplifying circuit 39. The amplifying circuit 39 has its output end connected to the drive electrode 41 of the first piezoelectric vibrating member 37 and the first drive electrode 42a of the second piezoelectric vibrating member 38.

Thus, the first detecting polarized portion 49a and the second detecting polarized portion 49b of the third piezoelectric vibrating member 49 deform similarly to the first polarized portion 38a and the second polarized portion 38b of the second piezoelectric vibrating member 38. The first detecting electrode 43g and the second detecting electrode 43h detect a drive signal having a drive frequency f0 as a main component caused by a piezoelectric effect due to the deformation in the first detecting polarized portion 49a and the second detecting polarized portion 49b. This drive signal is amplified by the amplifying circuit 39 and inputted to the drive electrode 41 of the first piezoelectric vibrating member 37 and the first drive electrode 42a of the second piezoelectric vibrating member 38.

Embodiment 5

Figure 26:
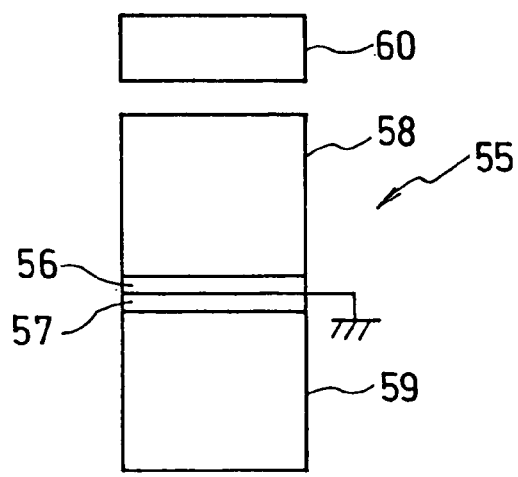
FIG. 26 is a view showing an ultrasonic motor according to Embodiment 5 of the present invention.
Figure 27:
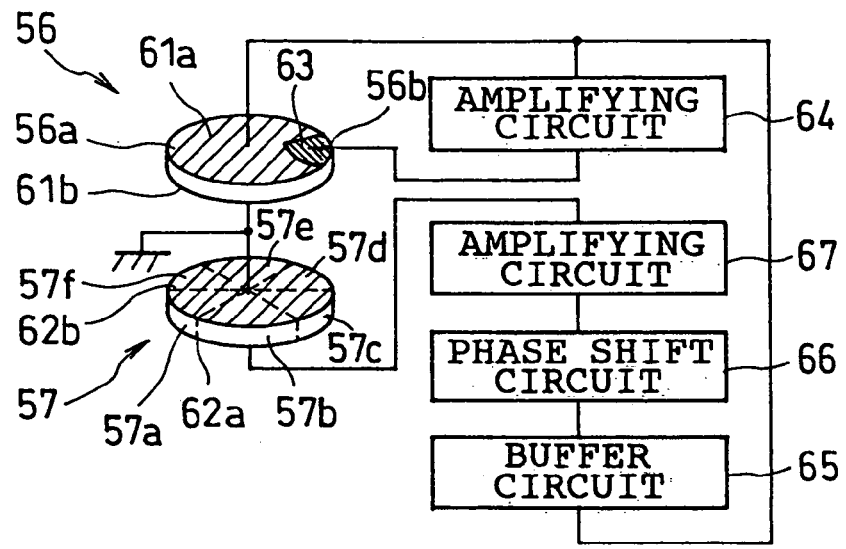
FIG. 27 shows a structure of piezoelectric elements with a block diagram of a drive circuit of an ultrasonic motor of FIG. 26.

FIG. 26 is a view showing a side face structure of an ultrasonic motor according to Embodiment 5 to which the invention is applied. FIG. 27 shows a block diagram having a structure of piezoelectric-elements with a drive circuit of this ultrasonic motor.

This ultrasonic motor is formed by a piezoelectric vibrating member 55 and a rotor 60 provided above the piezoelectric vibrating member 55.

The piezoelectric vibrating member 55 is formed by a vertical-vibration piezoelectric element 56, a torsion-vibration piezoelectric element 57 bonded to one surface of the vertical vibration piezoelectric element 56, a cylindrical first elastic member 58 bonded to the other surface of the vertical vibration piezoelectric element 56, and a cylindrical second elastic member 59 bonded to the torsional vibration piezoelectric element 57.

Here, the vertical oscillation piezoelectric element 56 is polarized by applying an electric field to the entire of the disc in its thickness direction, with a bond surface to the torsion oscillation piezoelectric element 57 given negative and the opposite surface to this bond surface given positive, being formed into a polarized portion 56a as a driving polarized portion of the invention. In FIG. 26, a drive electrode 61a is formed on almost the entire surface of the opposite surface to the bond surface, while an opposite electrode 61b is formed on the bond surface. Further, a detecting polarized portion 56b for signal detection is provided by utilizing part of an peripheral edge. Correspondingly to this, a detecting electrode 63 is formed. If a signal is inputted to between drive electrode 61a and the opposite electrode 61b, the detecting polarized portion 56b is deformed by vertical oscillation in the thickness direction of the polarized portion 56a. The detecting electrode 63 detects a drive signal caused based on the deformation in the detecting polarized portion 56b.

Because the detecting polarized portion 56b and the detecting electrode 63 are provided part of the polarized portion 56a, both the driving polarized portion 56a and the detecting polarized portion 56b equally deform in a direction of vertical oscillation. It is therefore possible to detect a drive signal having a drive frequency f0 as a maim component.

The torsional vibration piezoelectric element 57 is a disc member bonded together in a circumferential direction with, for example, six fan-shape members of a first polarized portion 57a, a second polarized portion 57b, a third polarized portion 57c, a fourth polarized portion 57d, a fifth polarized portion 57e and a sixth polarized portion 57f. The polarized portions 57a . . . 57f are each positively polarized, for example, with respect to a clockwise direction. A drive electrode 62a is formed on the entire of the opposite surface to the bond surface, while an opposite electrode 62b is formed on the bond surface. If a signal is inputted to between the drive electrode 62a and the opposite electrode 62b, the polarized portions 57a . . . 57f slip-vibrate with a same phase in the circumferential direction, resulting in circumferential torsional vibration as an entirety.

The drive circuit is formed by an amplifying circuit 64 having an input end connected to the detecting electrode 63 and one output end connected to the drive electrode 61a, a buffer circuit 65 having one end connected to the other output end of the amplifying circuit 64, a phase shift circuit 66 having one end connected to the other end of the buffer circuit 65, and a second amplifying circuit 67 having one end connected to the other end of the phase shift circuit 66 and the other end connected to the drive electrode 62a.

Figure 28:
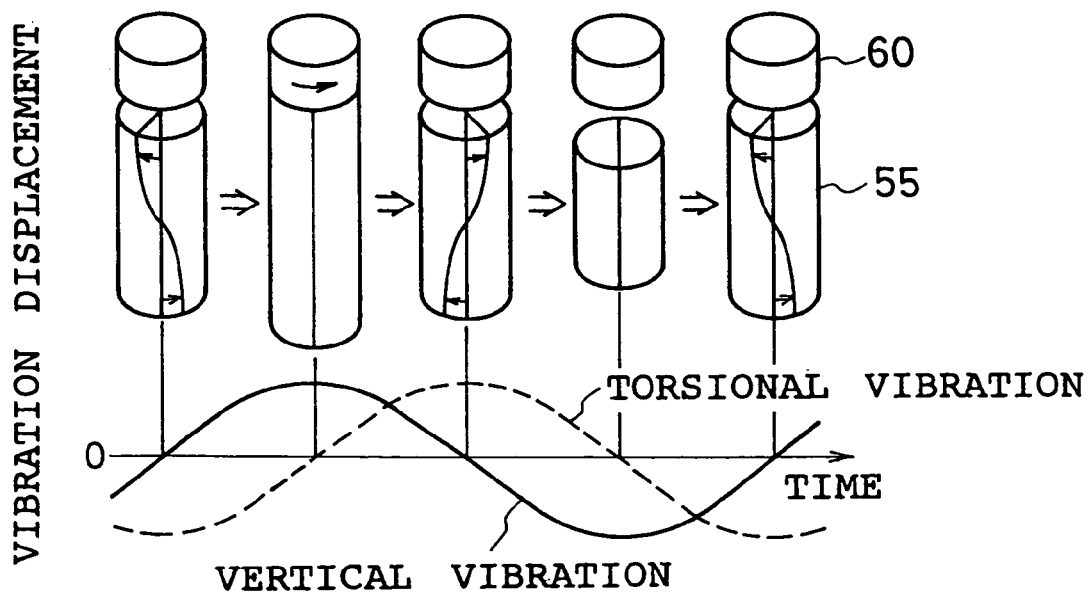
FIG. 28 is a view showing a relationship between an ultrasonic motor operation and piezoelectric element vibration displacement.

Now explanation is made on the operation of this ultrasonic motor based on FIGS. 27 and 28. FIG. 28 is a view showing a relationship between the operation of the ultrasonic motor and the displacement in vibration of the piezoelectric elements.

In FIG. 27, the detecting polarized portion 56b is deformed by the vibration of the polarized portion 56a in its thickness direction. The detecting electrode 63 detects a drive signal based on the deformation in the detecting polarized portion 56b.

At this time, the detecting polarized portion 56b deforms equally in the vertical vibration direction to the polarized portion 56a, and accordingly detects a drive signal having a drive frequency f0 component greater than unwanted frequency components.

This drive signal is amplified by the amplifying circuit 64 and is then inputted to the drive electrode 61a of the vertical oscillation piezoelectric element 56 and to the buffer circuit 65.

The signal inputted to the buffer circuit 65 is shifted in phase, for example, by 90 degrees by the phase shift circuit 66 and is then amplified by the second amplifying circuit 67, being inputted to the drive electrode 62a of the torsion piezoelectric element 57.

At this time, the polarized portion 56a of the vertical vibration piezoelectric element 56 oscillates vertically in the thickness direction to cause vertical waves in the elastic members 58, 59. On the other hand, the polarized portions 57a . . . 57f of the torsion piezoelectric element 57 slip-vibrate in the circumferential direction, giving rise to torsional vibration waves in the elastic members 58, 59. In FIG. 28, the vertical vibration wave and the torsional vibration wave are deviated in vibratory displacement by 90 degrees in time. Accordingly, the respective points on the piezoelectric vibrating member 55 end face elliptically vibrate to apply a circumferential frictional force onto the rotor 60, thereby rotating the rotor 60.

Meanwhile, the detecting electrode 63 may be provided on the torsion piezoelectric element 57. The position of that electrode is not limited to the peripheral edge, and may be anywhere provided that it is within a same plane.

According to the present embodiment, the detecting polarized portion 56b and the detecting electrode 63 were arranged to equally deform in the vertical vibration direction thereby detecting a signal with a drive frequency component as a main component. Accordingly, spurious vibration is suppressed and self-oscillation is stabilized.

In the present embodiment, the piezoelectric elements were overlaid in the thickness direction of the piezoelectric vibrating member 55. Alternatively, it is possible to use a structure that, for example, a cylindrical elastic member is divided in a lengthwise (diametrical) direction and piezoelectric elements are inserted to divisional surfaces and sandwiched between the elastic members. In this case, a piezoelectric sideways effect is utilized, for example, for vertical vibrational oscillation while slip-distortion is used for torsional vibrational oscillation is by applying voltage in a direction perpendicular to the polarization direction. The detecting polarized portion is provided close to a node in any one of the vibration modes.

Embodiment 6

FIGS. 29A–29B show an ultrasonic motor according to Embodiment 6 to which the invention is applied, wherein FIG. 29A is a perspective structure of a piezoelectric vibrating member with a drive circuit block diagram and FIG. 29B is a plane structure of the piezoelectric vibrating member.

A piezoelectric vibrating member 70 is formed, as shown in FIG. 29A, by a hollow cylindrical member equally divided into four in a circumferential direction to have a first polarized portion 70a as a first driving polarized portion of the invention, a second polarized portion 70b, a third polarized portion 70c as a second driving polarized portion of the invention, and a fourth polarized portion 70d.

In FIG. 29B, the first polarized portion 70a and the third polarized portion 70c are polarized by applying an electric field, for example, with their inner peripheries given positive and outer peripheries negative. The second polarized portion 70b and the fourth polarized portion 70d are polarized by applying an electric field, for example, with their inner peripheries given negative and outer peripheries positive.

Also, a detecting polarized portion 70e is provided in a part of the first polarized portion 70a such that it is symmetrical about a loop of a later-stated first flexion vibration wave to be caused in a longitudinal direction. Further, a first drive electrode 71a is formed correspondingly to the first polarized portion 70a, while a detecting electrode 72 is formed correspondingly to the detecting polarized portion 70e.

Also, the second polarized portion 70b, the third polarized portion 70c and the forth polarized portion 70d are formed, at their outer surfaces, with a second drive electrode 71b, a third drive electrode 71c and a forth drive electrode 71d. An opposite electrode 71e is formed on the inner surface of the cylindrical member.

The drive circuit is formed by an amplifying circuit 73 having an input end connected to the detecting electrode 72 and an output end connected to the first drive electrode 71a and the second drive electrode 71b, a buffer circuit 74 having one end connected to an output end of the amplifying circuit 73, and a phase shift circuit 75 having one end connected to the other end of the buffer circuit 74, and a second amplifying circuit 76 having an input end connected to the other end of the phase shift circuit 75 and an output end connected to the third drive electrode 71c and the fourth drive electrode 71d.

Now explanation is made on the operation of this ultrasonic motor based on FIGS. 29A–29B and FIGS. 30A–30D.

FIG. 30 is a view for explaining the operation of the piezoelectric vibrating member 70 of the ultrasonic motor according to Embodiment 6.

In FIG. 29A, the detecting polarized portion 70e deforms similarly to the first polarized portion 70a, and the detecting electrode 72 detects a drive signal with a drive frequency as a main component caused due to the deformation in the detecting polarized portion 70d. This drive signal is amplified by the amplifying circuit 73 and inputted to the first drive electrode 71a, the second drive electrode 71b and the buffer circuit 74.

The signal inputted to the buffer circuit 74 is deviated in phase, for example, by 90 degrees by the phase shift circuit 75, and is inputted to the second amplifying circuit 76 where it is amplified by the second amplifying circuit 76 and inputted to the third drive electrode 71c and the fourth drive electrode 71d.

At this time, the first polarized portion 70a and the second polarized portion 70b laterally vibrate differently in phase by 180 degrees from each other. When the first polarized portion 70a expands to a maximum, the second polarized portion 70b contracts to a maximum. Thus, the piezoelectric vibrating member 70 as its entirety gives rise to a first vibration wave.

On the other hand, the third polarized portion 70c and the fourth polarized portion 70d laterally vibrate in phase different by 180 degrees from each other, wherein they are shifted in phase by 90 degrees with respect to the first polarized portion 70a and the second polarized portion 70b. Accordingly, the piezoelectric vibrating member 70 as its entirety gives rise to a second flexion vibration wave that is perpendicular to the first flexion vibration wave and different in phase by 90 degrees.

Further, the piezoelectric vibrating member 70 has at its top surface a maximum displacement point which not only rotates in a circumferential direction but also elliptically vibrates due to the first flexion vibration wave and second flexion vibration wave as shown in FIGS. 30A–30D, thereby applying a frictional force to the rotor 77 and rotating the rotor 77.

According to the present embodiment, the detecting polarized portion 70e and the detecting electrode 72 were provided such that they are symmetrical about a loop of a flexion vibration wave oscillated by the driving polarized portions 70a, 70b. Due to this, detection is made for a drive signal with a drive frequency f0 as a main component. Furthermore, because of the provision of the buffer circuit 74 and the second amplifying circuit 76, the similar effect is obtained similar to Embodiment 2.

Embodiment 7

Figure 31B:
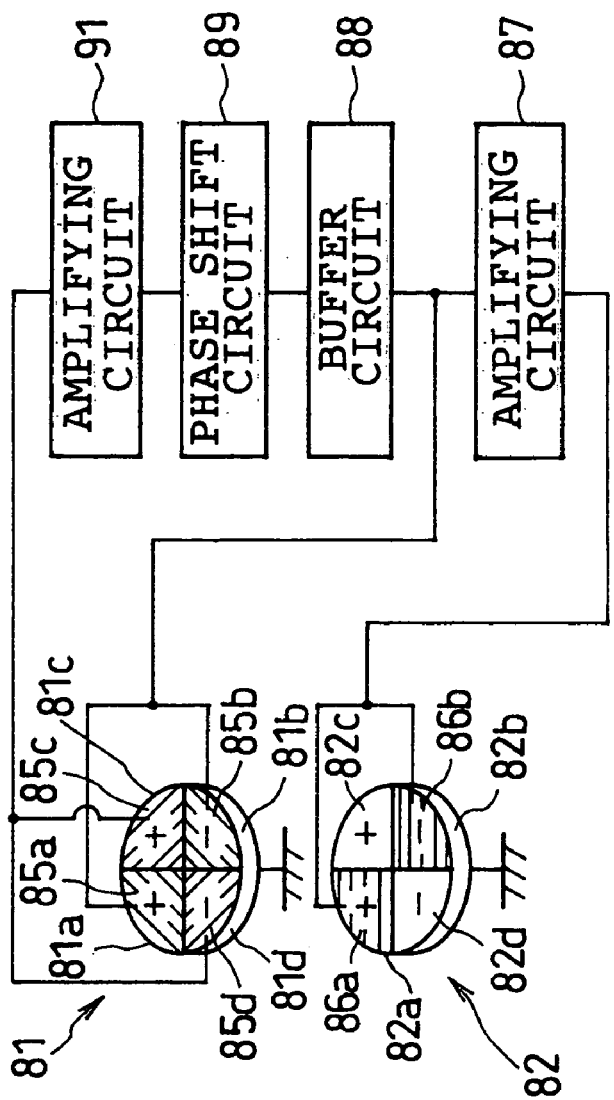
Figure 31A:
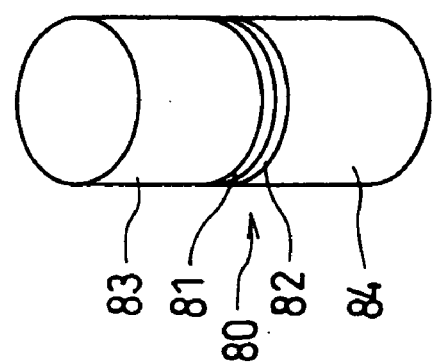

FIGS. 31A–31B show an ultrasonic motor according to Embodiment 7 to which the invention is applied, wherein FIG. 31A shows a perspective structure of a piezoelectric vibrating member 80 and FIG. 31B shows a block diagram of a drive circuit.

The piezoelectric vibrating member 80 of this ultrasonic motor is formed, as shown in FIG. 31A, by a driving piezoelectric element 81 in a disc form, a detecting piezoelectric element 82 in a disc form joined to the driving piezoelectric element 81, a first elastic member 83 in a cylindrical form bonded to the driving piezoelectric element 81 on an opposite side to the detecting piezoelectric element 82, and a second elastic member 84 in a cylindrical form bonded to the detecting piezoelectric element 82.

Here, the driving piezoelectric element 81 is circumferentially divided equally into four to provide a first polarized portion 81a as a driving polarized portion of the invention, a second polarized portion 81b, a third polarized portion 81c, and a fourth polarized portion 81d. The first polarized portion 81a and the third polarized portion 81c are polarized by taking in a thickness direction a first elastic member 83 side positive and a detecting piezoelectric element 82 side negative. A first drive electrode 85a and a third drive electrode 85c are formed on a surface of a first elastic member 83 side, while an opposite electrode is provided on a detecting piezoelectric element 82 side.

The second polarized portion 81b and the fourth polarized portion 81d are polarized by taking in a thickness direction a first elastic member 83 side positive and a detecting piezoelectric element 82 side negative. A second drive electrode 85b and a fourth drive electrode 85d are formed on a surface of a first elastic member 83 side, while an opposite electrode is provided on a detecting piezoelectric element 82 side.

The detecting piezoelectric element 82 is provided with a first detecting polarized portion 82a and second detecting polarized portion 82b as a detecting polarized portion of the invention polarized similarly to the driving piezoelectric element 81, and a third polarized portion 82c and fourth polarized portion 82d. Also, a first detecting electrode 86a is formed on a surface of a driving piezoelectric element 81 side correspondingly to the first detecting polarized portion 82a. A second detecting electrode 86b is formed corresponding to the second detecting polarized portion 82b. An opposite electrode is formed on a surface of a second elastic member 84 side.

By thus providing the first detecting polarized portion 82a and second detecting polarized portion 82b in a manner overlying the first polarized portion 81a and second polarized portion 81b, the first detecting polarized portion 82a and the second detecting polarized portion 82b are equally deformed in a vertical direction by vertical vibration of the first polarized portion 81a and the second polarized portion 81b similarly to the first polarized portion 81a and the second polarized portion 81b. Also, the detecting polarized portions 82a, 82b can be secured broad in area without decreasing the oscillation area in the first polarized portion 81a and the second polarized portion 81b.

The drive circuit is formed by an amplifying circuit 87 having an input end connected to the first detecting electrode 86a and the second detecting electrode 86b and an output end connected to the first drive electrode 85a and the second drive electrode 85b, a buffer circuit 88 having one end connected to one of output ends of the amplifying circuit 87, a phase shift circuit 89 having one end connected to the other end of the buffer circuit 88, and a second amplifying circuit ~91 having one end connected to the other end of the phase shift circuit 89 and the other end connected to the third drive electrode 85c and the fourth drive electrode 85d.

Now explanation is made on the operation of this ultrasonic motor.

The first detecting polarized portion 82a and the second detecting polarized portion 82b are equally deformed in a vertical direction by vertical vibration of the first polarized portion 81a and the second polarized portion 81b, similarly to the first polarized portion 81a and the second polarized portion 81b. The first detecting electrode 86a and the second detecting electrode 86b detect a drive signal with a drive frequency as a main component caused due to deformation in the first detecting polarized portion 82a and the second detecting polarized portion 82b.

This drive signal is amplified by the amplifying circuit 87 and is then inputted to the first drive electrode 85a, the second drive electrode 85b and the buffer circuit 88.

The signal inputted to the buffer circuit 88 is deviated in phase by, for example, 90 degrees by the phase shift circuit 89, and is then inputted to the second amplifying circuit 91 where it is amplified by the second amplifying circuit 91 and is inputted to the third drive electrode 85c and the fourth drive electrode 85d.

At this time, the first polarized portion 81a and the second polarized portion 81b of the driving piezoelectric element 81 vertically vibrate in the thickness direction differently in phase by 180 degrees from each other. Thus, the piezoelectric vibrating member 80 as its entirety gives rise to a first flexion vibration wave.

On the other hand, the third polarized portion 81c and the fourth polarized portion 81d vertically vibrate in the thickness direction differently in phase by 180 degrees from each other, while vibrating with a shift by 90 degrees from the vibration in the first polarized portion 81a and the second polarized portion 81b. Thus, the piezoelectric vibrating member 80 as its entirety gives rise to a second flexion vibration wave perpendicular to the first flexion vibration wave and different in phase by 90 degrees therefrom.

If the first flexion vibration wave and the second flexion vibration wave are combined, the maximum displacement point on the end face of the piezoelectric vibrating member 80 rotates in the circumferential direction and elliptically vibrates to apply a frictional force to the rotor, thereby rotating the rotor.

According to the present embodiment, the first detecting polarized portion 82a and the second detecting polarized portion 82b were made to be equally deformed by vertical vibration in the first polarized portion 81a and the second polarized portion 81b, similarly to the first polarized portion 81a and the second polarized portion 81b so that detection can be made for a drive signal with a drive frequency f0 as a main component. Therefore, spurious vibration is suppressed and self-oscillation is stabilized. Meanwhile, because the detecting electrodes 86a, 86b were secured broad in area without decrease in drive area of the driving piezoelectric element 81, a driving force is maintained.

Incidentally, the structure of the electrode and polarized portion is not limited to those in the present embodiment. They can be structured such that polarized portions equally divided into two are provided on which elements polarized in a thickness direction are put deviated in divisional surfaces by 90 degrees.

Embodiment 8

Figure 32:
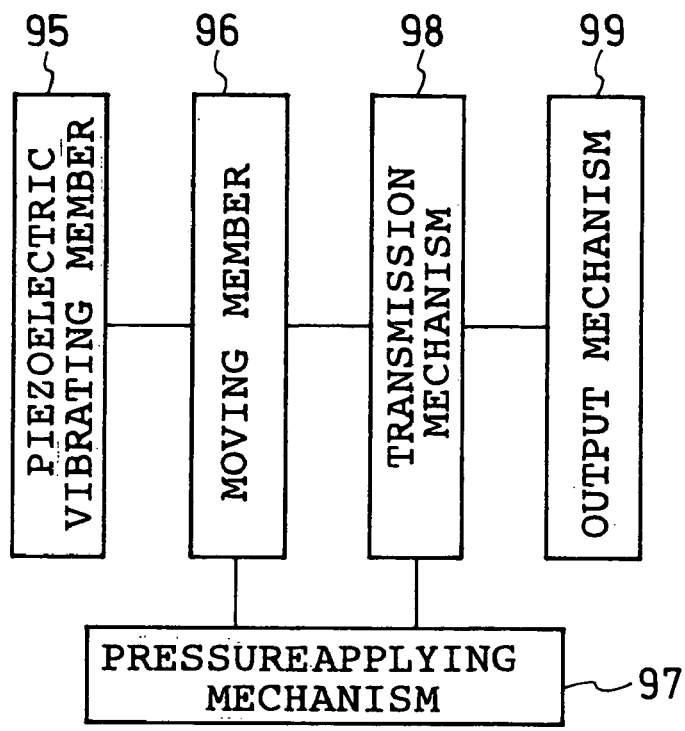
FIG. 32 is a view showing an electronic appliance with the ultrasonic motor according to Embodiment 8 of the present invention.
Figure 33:
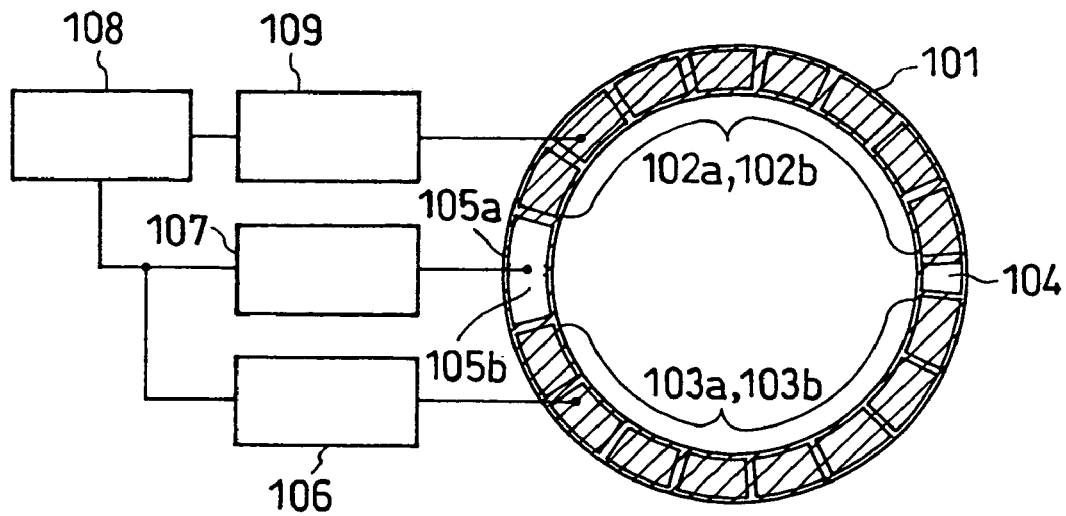
FIG. 33 is a view showing a first conventional example of an ultrasonic motor with a self-oscillation circuit.
Figure 34:
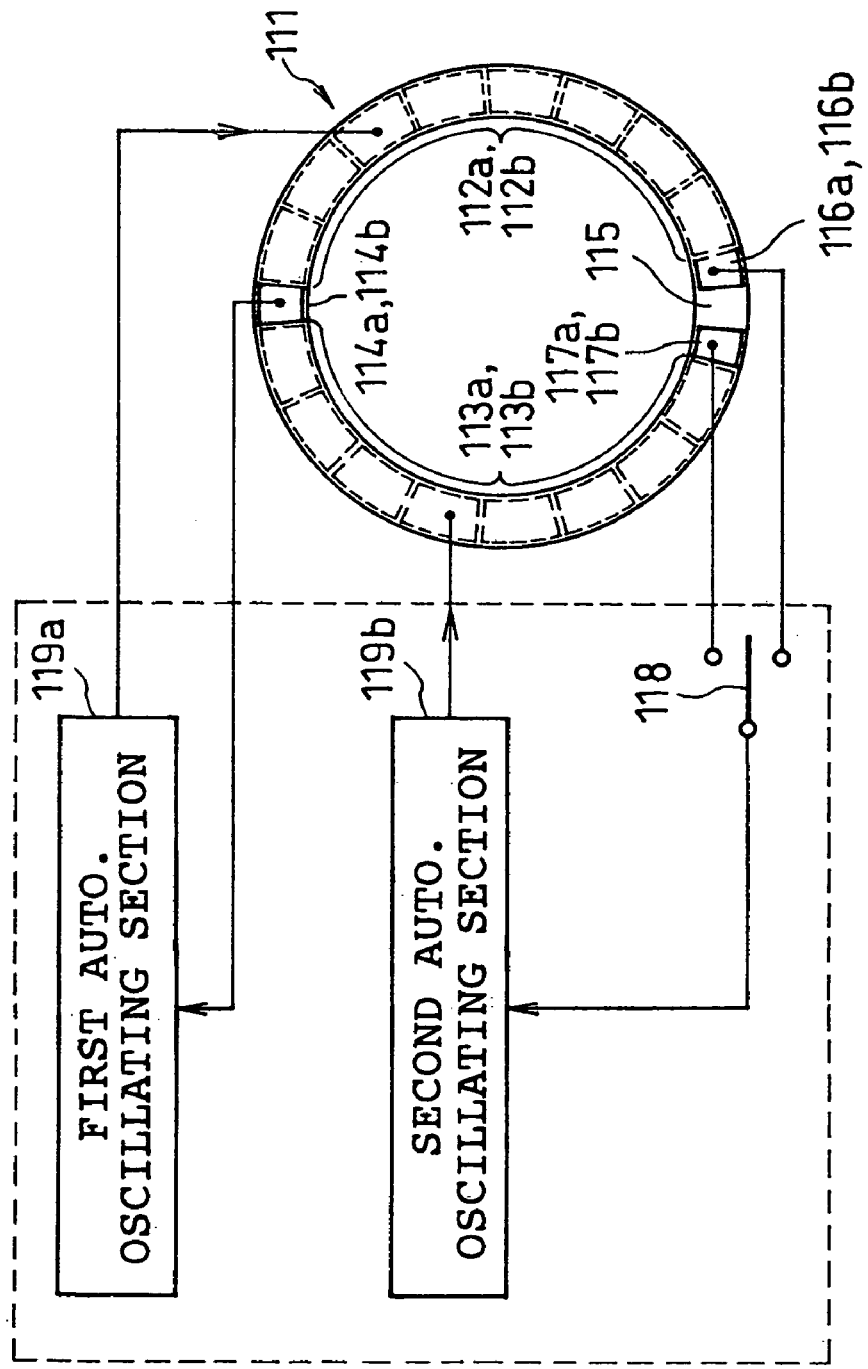
FIG. 34 is a view showing a second conventional example of an ultrasonic motor with a self-oscillation circuit.

FIG. 32 shows a block diagram of Embodiment 8 wherein an ultrasonic motor according to the invention is applied to an electronic appliance.

The electronic appliance comprises a piezoelectric vibrating member 95 as described above, a moving member 96 to be moved by the piezoelectric vibrating member 95, a pressurizing mechanism 97 for applying urging pressure to the moving member 96 and the piezoelectric vibrating member 95, a transmission mechanism 98 movable in association with the moving member 96, and an output mechanism 99 that moves based on operation of the transmission mechanism 98.

Here, the transmission mechanism 98 uses, for example, a transmission wheel such as a gear and frictional wheel. The output mechanism 99 is used, for example, for a shutter drive mechanism and lens drive mechanism in a camera, for an electronic timepiece a pointer drive mechanism and calendar drive mechanism in an electronic timepiece, and for a for a tool feed mechanism in a machine tool, and in a workpiece feed mechanism.

The electronic appliance with an ultrasonic motor according to the present embodiment is realized, for example, for an electronic timepiece, a measuring instrument, a camera, a printer, a printing machine, a machine tool, a robot, and a mobile device.

Also, a drive mechanism can be realized by an ultrasonic motor per se, if an output shaft is provided on the moving member 96 to provide a structure having a power transmitting mechanism to deliver torque through the output shaft.

According to the present invention, the detecting polarized portion is provided at a position including a portion where the vibrational distortion attains its maximum, thereby efficiently detecting only a signal with an objective vibration frequency.

For example, because a loop of a flexion vibration wave is taken as a center, a signal with a drive frequency great in magnitude is detected. Also, because the distortion is symmetrical about the center, the drive frequency component is detected large relative to unwanted frequency components. That is, detected is a drive signal comprising a drive frequency signal great in magnitude and less unwanted frequency components. Accordingly, spurious vibration is suppressed and self-oscillation in the piezoelectric vibrating member is stabilized.

Also, the detecting polarized portion is sufficiently secured without roduoing the oscillation area in the driving polarized portion. Accordingly, the drive force is maintained and a large drive signal can be extracted.

The amplified signal is decreased and outputted to the phase shift circuit while the signal amount within the self-oscillation loop is maintained. The load on the phase shift circuit is decreased and the gain of the self-oscillation loop is maintained. A stable self-oscillation drive is made possible for the ultrasonic motor driven by a plurality of input signals.

What is claimed is:

1. An ultrasonic motor comprising: a piezoelectric vibrating member having a detecting polarized portion for detecting a drive signal having a drive frequency of the detecting polarized portion and a driving polarized portion for receiving the drive signal to oscillate the piezoelectric vibrating member in self-excited oscillation to produce a drive force, the detecting polarized portion being disposed at a portion of the piezoelectric vibrating member which undergoes maximum deformation in at least one vibration mode of oscillation of the piezoelectric vibrating member; and an amplifying circuit for amplifying the drive signal detected by the detecting polarized portion and inputting the amplified signal to the driving polarized portion to oscillate the piezoelectric vibrating member.

2. An ultrasonic motor comprising: a piezoelectric vibrating member having a detecting polarized portion for detecting a drive signal having a drive frequency of the detecting polarized portion and a driving polarized portion for receiving the drive signal to produce a flexion vibration wave for oscillating the piezoelectric vibrating member in self-excited oscillation to produce a drive force, the detecting polarized portion being disposed at a portion of the piezoelectric vibrating member which undergoes maximum deformation in at least one vibration mode of oscillation of the piezoelectric vibrating member and being disposed at a position symmetrical about a loop of the flexion vibration wave; and an amplifying circuit for amplifying the drive signal detected by the detecting polarized portion and inputting the amplified signal to the driving polarized portion to oscillate the piezoelectric vibrating member.

3. An ultrasonic motor comprising: a piezoelectric vibrating member having a first driving polarized portion for generating a first flexion vibration wave, a second driving polarized portion for generating a second flexion vibration wave having a phase different from that of the first flexion vibration wave, and a detecting polarized portion disposed at a portion of the piezoelectric vibrating member which undergoes maximum deformation in at least one vibration mode of oscillation of the piezoelectric vibrating member and disposed at a position symmetrical about a loop of one of the first flexion vibration wave and the second flexion vibration wave for detecting a drive signal having a drive frequency of the detecting polarized portion in accordance with oscillation of the first driving polarized portion; and an amplifying circuit for amplifying the drive signal detected by the detecting polarized portion and inputting the amplified signal to one of the first and second driving polarized portions for oscillating the piezoelectric vibrating member in self-excited oscillation to produce a drive force.

4. An ultrasonic motor according to claim 3; further comprising a phase shift circuit for shifting a phase of the drive signal amplified by the amplifying circuit and inputting the drive signal shifted in phase to the other of the first and second driving polarized portions.

5. An ultrasonic motor comprising: a piezoelectric vibrating member having a first driving polarized portion for generating a stretching vibration wave, a second driving polarized portion for generating a flexion vibrating wave, and a detecting polarized portion disposed at a portion of the piezoelectric vibrating member which undergoes maximum deformation in at least one vibration mode of oscillation of the piezoelectric vibrating member and disposed at a position symmetrical about one of a node of the stretching vibration wave and a loop of the flexion vibration wave for detecting a drive signal having a drive frequency of the detecting polarized portion in accordance with oscillation of one of the first driving polarized portion and the second driving polarized portion, respectively; and amplifying means for amplifying the drive signal detected by the detecting polarized portion and inputting the amplified signal to the first and second driving polarized portions for oscillating the piezoelectric vibrating member in self-excited oscillation to produce a drive force.

6. An ultrasonic motor according to claim 5; wherein the detecting polarized portion is disposed symmetrical about the node of the stretching vibration wave for detecting the drive signal in accordance with oscillation of the first driving polarized portion.

7. An ultrasonic motor according to claim 6; wherein the amplifying means includes means for feeding the amplified signal back to one of the first and second driving polarized portions.

8. An ultrasonic motor according to claim 7; further comprising a phase shift circuit disposed between the amplifying means and one of the first and second driving polarized portions for shifting a phase of the drive signal amplified by the amplifying means.

9. An ultrasonic motor according to claim 3; wherein the piezoelectric vibrating member is generally cylindrical-shaped and has an end face disposed at a maximum displacement point for undergoing movement by the oscillation generated by the first flexion vibrating wave and the second flexion vibrating wave.

10. An ultrasonic motor comprising: a piezoelectric vibrating member; a driving electrode disposed on the piezoelectric vibrating member for undergoing vertical vibration to vibrate the piezoelectric vibrating member in self-excited vibration to produce a drive force; a detecting electrode for detecting a drive signal having a drive frequency of the detecting electrode in accordance with vibration of the driving electrode, the detecting electrode being disposed at a portion of the piezoelectric vibrating member which undergoes maximum deformation in at least one vibration mode of oscillation of the piezoelectric vibrating member; and an amplifying circuit for amplifying the drive signal detected by the detecting electrode and inputting the amplified drive signal to the driving electrode to vibrate the piezoelectric vibrating member.

11. An ultrasonic motor comprising: a piezoelectric vibrating member; a driving electrode disposed on the piezoelectric vibrating member for undergoing torsional vibration to vibrate the piezoelectric vibrating member in self-excited vibration to produce a drive force; a detecting electrode for detecting a drive signal having a drive frequency of the detecting electrode in accordance with vibration of the driving electrode, the detecting electrode being disposed at a portion of the piezoelectric vibrating member which undergoes maximum deformation in at least one vibration mode of oscillation of the piezoelectric vibrating member; and an amplifying circuit for amplifying the drive signal detected by the detecting electrode and inputting the amplified drive signal to the driving electrode to vibrate the piezoelectric vibrating member.

12. An ultrasonic motor according to claim 10; wherein the detecting electrode is spaced apart from the driving electrode in a vertical vibrating direction thereof.

13. An ultrasonic motor according to claim 11; wherein the detecting electrode is spaced apart from the driving electrode in a thickness direction thereof.

14. An ultrasonic motor according to claim 1; wherein the detecting polarized portion overlies and is integral with the driving polarized portion.

15. An electronic apparatus comprising: an ultrasonic motor as claimed in claim 1; a moving member connected to the piezoelectric vibrating member of the ultrasonic motor for undergoing movement in accordance with oscillation of the piezoelectric vibrating member; an output mechanism; and a transmission mechanism for transmitting movement of the moving member to the output mechanism.

16. An ultrasonic motor according to claim 2; wherein the detecting polarized portion overlies and is integral with the driving polarized portion.

17. An electronic apparatus comprising: an ultrasonic motor as claimed in claim 2; a moving member connected to the piezoelectric vibrating member of the ultrasonic motor for undergoing movement in accordance with oscillation of the piezoelectric vibrating member; an output mechanism; and a transmission mechanism for transmitting movement of the moving member to the output mechanism.

18. An ultrasonic motor according to claim 3; wherein the detecting polarized portion overlies and is integral with the driving polarized portion.

19. An ultrasonic motor according to claim 3; further comprising a phase shift circuit for shifting a phase of the drive signal amplified by the amplifying circuit; and a buffer circuit having a high input impedance and a low output impedance disposed between the amplifying circuit and the phase shift circuit.

20. An ultrasonic motor according to claim 19; further comprising a second amplifying circuit disposed between the phase shift circuit and the second driving polarized portion for amplifying the drive signal shifted in phase by the phase shift circuit.

21. An electronic apparatus comprising: an ultrasonic motor as claimed in claim 3; a moving member connected to the piezoelectric vibrating member of the ultrasonic motor for undergoing movement in accordance with oscillation of the piezoelectric vibrating member; an output mechanism; and a transmission mechanism for transmitting movement of the moving member to the output mechanism.

22. An ultrasonic motor according to claim 4; wherein the detecting polarized portion overlies and is integral with the driving polarized portion.

23. An ultrasonic motor according to claim 4; further comprising a buffer circuit having a high input impedance and a low output impedance disposed between the amplifying circuit and the phase shift circuit.

24. An ultrasonic motor according to claim 23; further comprising a second amplifying circuit disposed between the phase shift circuit and the second driving polarized portion for amplifying the drive signal shifted in phase by the phase shift circuit.

25. An ultrasonic motor according to claim 5; wherein the amplifying means includes means for feeding the amplified signal back to one of the first and second electrodes.

26. An ultrasonic motor according to claim 5; wherein the detecting electrode overlies and is integral with the driving electrode.

27. An electronic apparatus comprising: an ultrasonic motor as claimed in claim 5; a moving member connected to the piezoelectric vibrating member of the ultrasonic motor for undergoing movement in accordance with oscillation of the piezoelectric vibrating member; an output mechanism; and a transmission mechanism for transmitting movement of the moving member to the output mechanism.

28. An ultrasonic motor according to claim 5; wherein the detecting polarized portion is disposed symmetrical about the loop of the flexion vibration wave for detecting the drive signal in accordance with the second driving polarized portion.

29. An ultrasonic motor according to claim 6; wherein the detecting electrode overlies and is integral with the driving electrode.

30. An ultrasonic motor according to claim 7; wherein the detecting electrode overlies and is integral with the driving electrode.

31. An ultrasonic motor according to claim 8; wherein the detecting electrode overlies and is integral with the driving electrode.

32. An ultrasonic motor according to claim 8; further comprising a buffer circuit having a high input impedance and a low output impedance disposed between the amplifying circuit and the phase shift circuit.

33. An ultrasonic motor according to claim 32; further comprising a second amplifying circuit disposed between the phase shift circuit and the second driving polarized portion for amplifying the drive signal shifted in phase by the phase shift circuit.

34. An ultrasonic motor according to claim 10; wherein the detecting electrode is disposed on a portion of the driving electrode.

35. An electronic apparatus comprising: an ultrasonic motor as claimed in claim 10; a moving member connected to the piezoelectric vibrating member of the ultrasonic motor for undergoing movement in accordance with oscillation of the piezoelectric vibrating member; an output mechanism; and a transmission mechanism for transmitting movement of the moving member to the output mechanism.

36. An ultrasonic motor according to claim 11; wherein the detecting electrode is disposed on a portion of the driving electrode.

37. An electronic apparatus comprising: an ultrasonic motor as claimed in claim 11; a moving member connected to the piezoelectric vibrating member of the ultrasonic motor for undergoing movement in accordance with oscillation of the piezoelectric vibrating member; an output mechanism; and a transmission mechanism for transmitting movement of the moving member to the output mechanism.

* * * * *